United States Patent
Nogiwa

(10) Patent No.: US 11,532,920 B2
(45) Date of Patent: Dec. 20, 2022

(54) LASER APPARATUS, EUV LIGHT GENERATING SYSTEM, AND ELECTRONIC DEVICE MANUFACTURING METHOD

(71) Applicant: Gigaphoton Inc., Tochigi (JP)

(72) Inventor: Seiji Nogiwa, Tochigi (JP)

(73) Assignee: Gigaphoton Inc., Tochigi (JP)

( * ) Notice: Subject to any disclaimer, the term of this patent is extended or adjusted under 35 U.S.C. 154(b) by 366 days.

(21) Appl. No.: 16/865,803

(22) Filed: May 4, 2020

(65) Prior Publication Data

US 2020/0266603 A1 Aug. 20, 2020

Related U.S. Application Data

(63) Continuation of application No. PCT/JP2017/045325, filed on Dec. 18, 2017.

(51) Int. Cl.
*H01S 3/13* (2006.01)
*H01S 3/131* (2006.01)
(Continued)

(52) U.S. Cl.
CPC .......... *H01S 3/1317* (2013.01); *H01S 3/0941* (2013.01); *H01S 3/1305* (2013.01);
(Continued)

(58) Field of Classification Search
CPC .. H01S 3/0602; H01S 3/08095; H01S 3/0941; H01S 3/1305; H01S 3/1317; H05G 2/008
See application file for complete search history.

(56) References Cited

U.S. PATENT DOCUMENTS

| 4,703,491 A * | 10/1987 | Lim ........................ H01S 3/086 |
| | | 372/107 |
| 5,926,495 A * | 7/1999 | Guch, Jr. .............. H01S 5/0687 |
| | | 372/75 |

(Continued)

FOREIGN PATENT DOCUMENTS

| JP | 2000252553 A | 9/2000 |
| JP | 2000269576 A | 9/2000 |

(Continued)

OTHER PUBLICATIONS

International Search Report issued in PCT/JP2017/045325; dated Mar. 6, 2018.

(Continued)

*Primary Examiner* — Michael Carter
(74) *Attorney, Agent, or Firm* — Studebaker & Brackett PC

(57) ABSTRACT

A laser apparatus according to the present disclosure includes an excitation light source configured to output excitation light, a laser crystal disposed on an optical path of the excitation light, a first monitor device disposed on an optical path of transmitted excitation light after having transmitted through the laser crystal to monitor the transmitted excitation light, a temperature adjustment device configured to adjust a temperature of the excitation light source to a constant temperature based on a temperature command value, and a controller configured to change the temperature command value based on a result of monitoring by the first monitor device.

6 Claims, 12 Drawing Sheets

(51) Int. Cl.
*H01S 3/0941* (2006.01)
*H05G 2/00* (2006.01)
*H01S 3/06* (2006.01)
*H01S 3/16* (2006.01)
*H01S 3/08* (2006.01)

(52) U.S. Cl.
CPC ............ *H05G 2/008* (2013.01); *H01S 3/0602* (2013.01); *H01S 3/08095* (2013.01); *H01S 3/1673* (2013.01)

(56) References Cited

U.S. PATENT DOCUMENTS

| | | |
|---|---|---|
| 2008/0069156 A1 | 3/2008 | Kasamatsu |
| 2016/0316551 A1* | 10/2016 | Kurosawa ............. H01S 3/2325 |
| 2018/0342849 A1 | 11/2018 | Nogiwa et al. |

FOREIGN PATENT DOCUMENTS

| | | |
|---|---|---|
| JP | 2004259954 A | 9/2004 |
| JP | 2004356166 A | 12/2004 |
| JP | 2008034459 A | 2/2008 |
| JP | 2010239039 A | 10/2010 |
| JP | 2012042630 A | 3/2012 |
| WO | 2017168584 A1 | 10/2017 |
| WO | WO2017168584 | * 10/2017 |

OTHER PUBLICATIONS

International Preliminary Report on Patentability and Written Opinion issued in PCT/JP2017/045325; dated Jun. 23, 2020.

* cited by examiner

| COOLING WATER TEMPERATURE | LOW | APPROPRIATE | HIGH |
|---|---|---|---|
| EXCITED LIGHT WAVELENGTH | SHORT WAVELENGTH | OPTIMAL WAVELENGTH | LONG WAVELENGTH |
| ABSORPTION COEFFICIENT OF LASER CRYSTAL (YVO$_4$) | SMALL | LARGE | SMALL |
| GAIN OF RESONATOR OR AMPLIFIER | SMALL | LARGE | SMALL |
| LASER OUTPUT | SMALL | LARGE | SMALL |

LASER APPARATUS, EUV LIGHT GENERATING SYSTEM, AND ELECTRONIC DEVICE MANUFACTURING METHOD

CROSS-REFERENCE TO RELATED APPLICATIONS

The present application is a continuation application of International Application No. PCT/JP2017/045325, filed on Dec. 18, 2017, the entire contents of which are hereby incorporated by reference.

BACKGROUND

1. Technical Field

The present disclosure relates to a laser apparatus, an EUV light generating system, and an electronic device manufacturing method.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, it is desired to develop an exposure device including a device configured to generate extreme ultraviolet (EUV) light at a wavelength of 13 nm approximately in combination with a reduced projection reflective optical system.

Disclosed EUV light generating apparatuses include three kinds of devices: a laser produced plasma (LPP) device that uses plasma generated by irradiating a target substance with a laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: Japanese Unexamined Patent Application Publication No. 2004-356166
Patent Document 2: Japanese Unexamined Patent Application Publication No. 2008-34459
Patent Document 3: Japanese Unexamined Patent Application Publication No. 2010-239039
Patent Document 4: Japanese Unexamined Patent Application Publication No. 2012-42630

SUMMARY

A laser apparatus of the present disclosure includes an excitation light source configured to output excitation light, a laser crystal disposed on an optical path of the excitation light, a first monitor device disposed on an optical path of transmitted excitation light after having transmitted through the laser crystal to monitor the transmitted excitation light, a temperature adjustment device configured to adjust a temperature of the excitation light source to a constant temperature based on a temperature command value, and a controller configured to change the temperature command value based on a result of monitoring by the first monitor device.

An EUV light generating system of the present disclosure includes an EUV chamber in which EUV light is generated, and a laser apparatus configured to emit a laser beam to be guided to the EUV chamber. The laser apparatus includes an excitation light source configured to output excitation light, a laser crystal disposed on an optical path of the excitation light, a first monitor device disposed on an optical path of transmitted excitation light after having transmitted through the laser crystal to monitor the transmitted excitation light, a temperature adjustment device configured to adjust a temperature of the excitation light source to a constant temperature based on a temperature command value, and a controller configured to change the temperature command value based on a result of monitoring by the first monitor device.

An electronic device manufacturing method of the present disclosure includes generating EUV light by an EUV light generating apparatus including an excitation light source configured to output excitation light, a laser crystal disposed on an optical path of the excitation light, a first monitor device disposed on an optical path of transmitted excitation light after having transmitted through the laser crystal to monitor the transmitted excitation light, a temperature adjustment device configured to adjust a temperature of the excitation light source to a constant temperature based on a temperature command value, and a controller configured to change the temperature command value based on a result of monitoring by the first monitor device; outputting the EUV light to an exposure apparatus; and exposing a photosensitive substrate to the EUV light by using the exposure apparatus to manufacture an electronic device.

BRIEF DESCRIPTION OF THE DRAWINGS

Embodiments of the present disclosure will be described below as examples with reference to the accompanying drawings.

DESCRIPTION OF EMBODIMENTS

<Contents>
<1. Overall description of EUV light generating apparatus> (FIG. 1)
   1.1 Configuration
   1.2 Operation
<2. Comparative example> (FIGS. 2 to 4)
   2.1 Configuration
   2.2 Operation
   2.3 Problem
<3. Embodiment 1> (laser apparatus including monitor device) (FIG. 5)
   3.1 Configuration
   3.2 Operation
   3.3 Action/Effect
<4. Embodiment 2> (laser apparatus including power monitor) (FIG. 6)
   4.1 Configuration
   4.2 Operation
   4.3 Action/Effect
<5. Embodiment 3> (laser apparatus including wavelength monitor) (FIG. 7)
   5.1 Configuration
   5.2 Operation
   5.3 Action/Effect
<6. Embodiment 4> (first exemplary laser apparatus including amplifier) (FIG. 8)
   6.1 Configuration
   6.2 Operation
   6.3 Action/Effect
<7. Embodiment 5> (second exemplary laser apparatus including amplifier) (FIG. 9)
   7.1 Configuration
   7.2 Operation
   7.3 Action/Effect
<8. Embodiment 6> (third exemplary laser apparatus including amplifier) (FIG. 10)
   8.1 Configuration
   8.2 Operation
   8.3 Action/Effect
<9. Embodiment 7> (laser apparatus including two power monitors) (FIG. 11)
   9.1 Configuration
   9.2 Operation
   9.3 Action/Effect
<10. Embodiment 8> (EUV light generating system including pre-pulse laser apparatus) (FIG. 12)
   10.1 Configuration and operation
<11. Embodiment 9> (electronic device manufacturing method) (FIG. 13)
<12. Other>

Embodiments of the present disclosure will be described below in detail with reference to the accompanying drawings.

The embodiments described below are examples of the present disclosure, and do not limit the contents of the present disclosure. Not all configurations and operations described in each embodiment are necessarily essential as configurations and operations of the present disclosure.

Components identical to each other are denoted by an identical reference sign, and duplicate description thereof will be omitted.

1. Overall Description of EUV Light Generating Apparatus

1.1 Configuration

Figure 1:
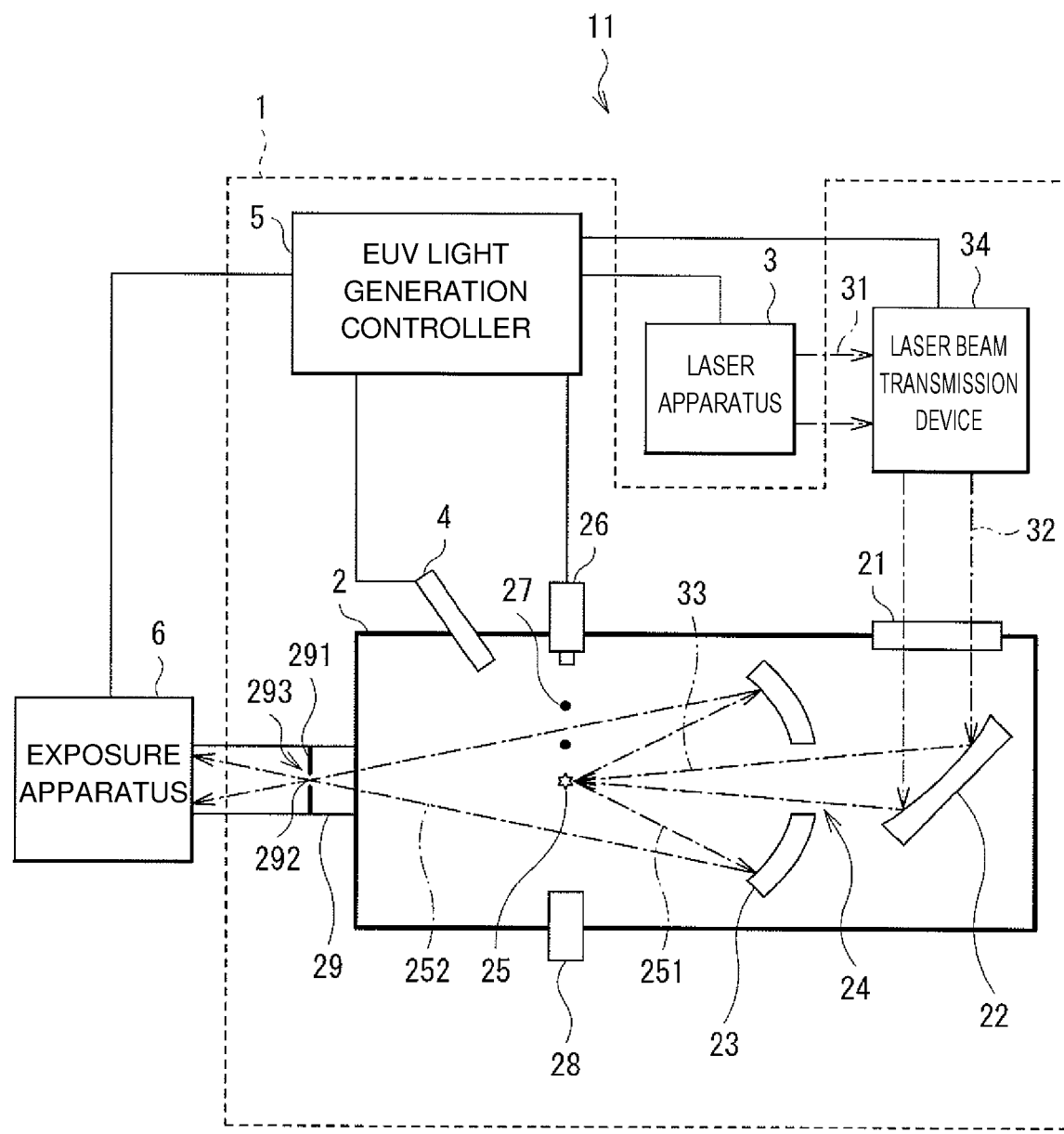
FIG. 1 schematically illustrates an exemplary configuration of an exemplary LPP EUV light generating system.

FIG. 1 schematically illustrates the configuration of an exemplary LPP EUV light generating system. An EUV light generating apparatus 1 is used together with at least one laser apparatus 3 in some cases. In the present application, a system including the EUV light generating apparatus 1 and the laser apparatus 3 is referred to as an EUV light generating system 11. As illustrated in FIG. 1 and described below in detail, the EUV light generating apparatus 1 includes a chamber 2 and a target supply unit 26. The chamber 2 is a sealable container. The target supply unit 26 supplies a target substance into the chamber 2 and is attached to, for example, penetrate through a wall of the chamber 2. The material of the target substance may contain tin, terbium, gadolinium, lithium, xenon, or a combination of any two or more of these materials, but is not limited thereto.

The wall of the chamber 2 is provided with at least one through-hole. The through-hole is blocked by a window 21 through which a pulse laser beam 32 output from the laser apparatus 3 transmits. For example, an EUV light condensing mirror 23 having a spheroidal reflective surface is disposed inside the chamber 2. The EUV light condensing mirror 23 has first and second focal points. For example, a multi-layer reflection film obtained by alternately stacking molybdenum and silicon is formed on the surface of the EUV light condensing mirror 23. The EUV light condensing mirror 23 may be disposed so that, for example, the first focal point is positioned in a plasma generating region 25 and the second focal point is positioned at an intermediate focus point (IF) 292. The EUV light condensing mirror 23 is provided with a through-hole 24 at a central part thereof through which a pulse laser beam 33 passes.

The EUV light generating apparatus 1 includes an EUV light generating controller 5, a target sensor 4, and the like. The target sensor 4 detects one or a plurality of the existence, locus, position, and speed of a target 27. The target sensor 4 may have an image capturing function.

The EUV light generating apparatus 1 also includes a connection unit 29 that provides communication between the inside of the chamber 2 and the inside of an exposure apparatus 6. A wall 291 on which an aperture 293 is formed is provided inside the connection unit 29. The wall 291 is disposed so that the aperture 293 is positioned at the second focal point of the EUV light condensing mirror 23.

In addition, the EUV light generating apparatus 1 includes a laser beam transmission device 34, a laser beam condensing mirror 22, a target collecting unit 28 for collecting the target 27, and the like. The laser beam transmission device 34 includes an optical element for defining the transmission state of a laser beam, and an actuator for adjusting the position, posture, and the like of the optical element.

1.2 Operation

The following describes operation of the exemplary LPP EUV light generating system with reference to FIG. 1. A pulse laser beam 31 output from the laser apparatus 3 passes through the laser beam transmission device 34 and is incident in the chamber 2 through the window 21 as the pulse laser beam 32. The pulse laser beam 32 travels along at least one laser beam path in the chamber 2, is reflected by the laser beam condensing mirror 22, and irradiates at least one target 27 as the pulse laser beam 33.

The target supply unit 26 outputs the target 27 made of the target substance toward the plasma generating region 25 in the chamber 2. The target 27 is irradiated with at least one pulse included in the pulse laser beam 33. Plasma is generated when the target 27 is irradiated with the pulse laser beam, and radiates radiation light 251. EUV light 252 included in the radiation light 251 is selectively reflected by the EUV light condensing mirror 23. Having been reflected by the EUV light condensing mirror 23, the EUV light 252 is condensed at the intermediate focus point 292 and output to the exposure apparatus 6. One target 27 may be irradiated with a plurality of pulses included in the pulse laser beam 33.

The EUV light generating controller 5 collectively controls the entire EUV light generating system 11. The EUV light generating controller 5 processes a result of detection by the target sensor 4. The EUV light generating controller 5 may control, for example, the output timing of the target 27, the output direction of the target 27, and the like based on the result of detection by the target sensor 4. In addition, the EUV light generating controller 5 may control, for example, the oscillation timing of the laser apparatus 3, the traveling direction of the pulse laser beam 32, the focusing position of the pulse laser beam 33, and the like. These various kinds of control are merely exemplary, and may include other control as necessary.

2. Comparative Example

2.1 Configuration

Figure 2:
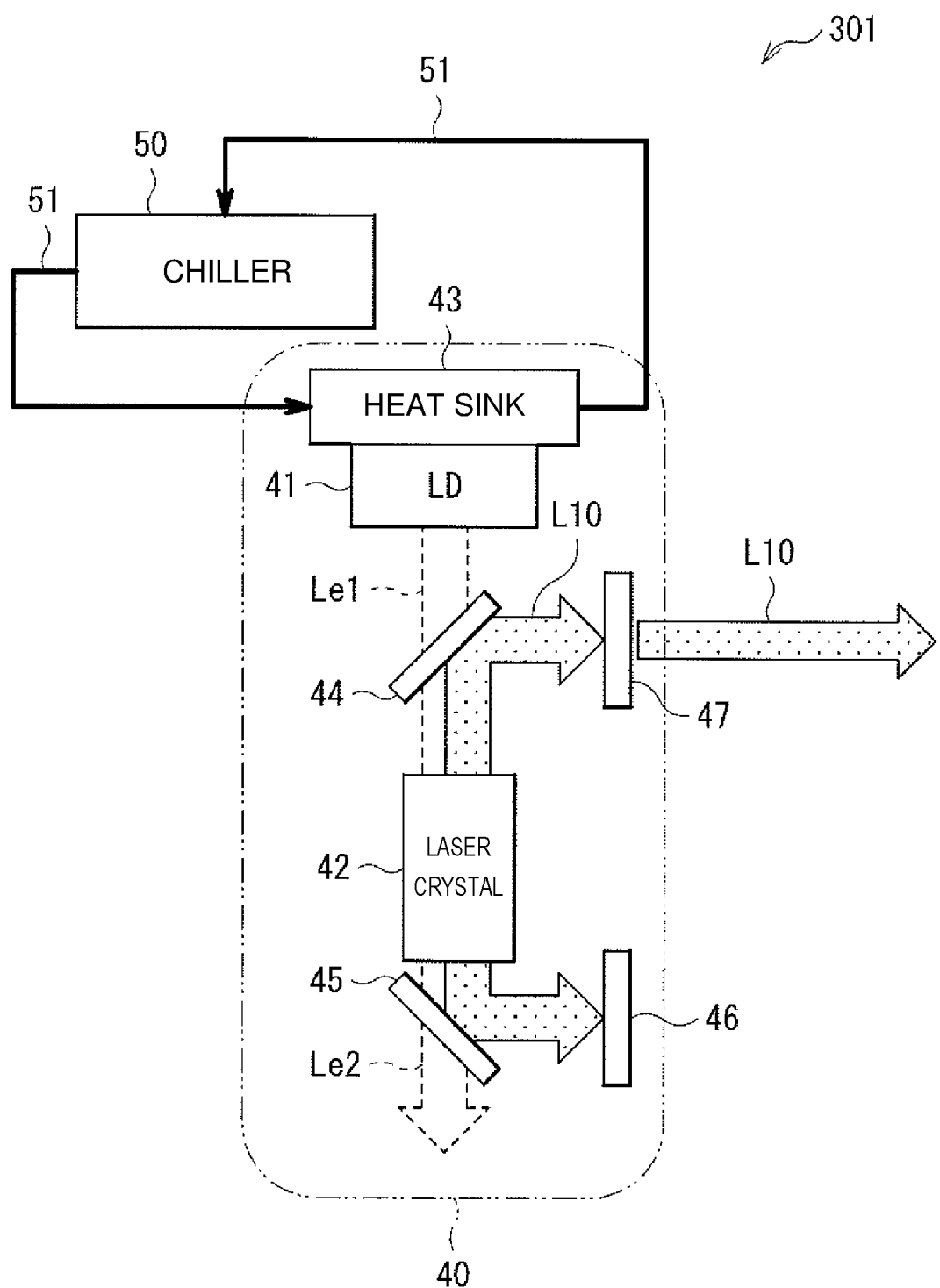
FIG. 2 schematically illustrates an exemplary configuration of a laser apparatus according to a comparative example.

FIG. 2 schematically illustrates an exemplary configuration of a laser apparatus 301 according to a comparative example.

The laser apparatus 301 according to the comparative example includes a solid-state laser 40, and a chiller 50 connected with the solid-state laser 40.

The solid-state laser 40 includes a laser diode (LD) 41, a laser crystal 42, a heat sink 43, a first wavelength selection mirror 44, a second wavelength selection mirror 45, a first resonance mirror 46, and a second resonance mirror 47.

The laser crystal 42 is an amplification medium disposed on the optical path of excitation light Le1 and excited by the excitation light Le1. The laser crystal 42 is, for example, $YVO_4$.

The LD 41 is an excitation light source configured to output the excitation light Le1 for exciting the laser crystal 42 as an amplification medium. When excited by the excitation light Le1, the laser crystal 42 emits a laser beam L10. The excitation light Le1 having transmitted through the laser crystal 42 is output from the laser crystal 42 as transmitted excitation light Le2.

The first resonance mirror 46 and the second resonance mirror 47 form a resonator configured to resonate the laser beam L10 generated through excitation of the laser crystal 42.

The first resonance mirror 46 and the second resonance mirror 47 are each a dielectric multi-layered film mirror configured to highly reflect, for example, light having a wavelength of 1064 nm. The first resonance mirror 46 has a reflectance of, for example, 100% approximately. The second resonance mirror 47 has a reflectance of, for example, 95% approximately.

The first wavelength selection mirror 44 aligns the optical path of the excitation light Le1 from the LD 41 and the optical path of the laser beam L10 generated by the laser crystal 42 with each other. The second wavelength selection mirror 45 separates the optical path of the transmitted excitation light Le2 and the optical path of the laser beam L10. The first wavelength selection mirror 44 and the second wavelength selection mirror 45 are each a dielectric multi-layered film mirror configured to highly reflect, for example, light having a wavelength of 1064 nm and highly transmit, for example, light having a wavelength of 880 nm.

The heat sink 43 is provided to the LD 41 to release heat from the LD 41. The heat sink 43 may be a micro-channel heat sink including a minute cooling water flow path.

The chiller 50 is a temperature adjustment device configured to adjust the temperature of the LD 41 to a constant temperature through the heat sink 43 by circulating cooling water 51 through the heat sink 43.

The solid-state laser 40 may be a ring shape laser having a configuration in which an optical path orbits without the first resonance mirror 46 and the second resonance mirror 47.

Alternatively, the solid-state laser 40 may be a multiple resonator laser including three or more resonance mirrors.

2.2 Operation

The laser apparatus 301 outputs the laser beam L10 from the second resonance mirror 47 included in the solid-state laser 40.

The chiller 50 controls the temperature of the cooling water 51 supplied to the heat sink 43 in the solid-state laser 40. The chiller 50 controls the LD 41 to a constant temperature through the heat sink 43 by circulating the cooling water 51, the temperature of which is controlled, through the heat sink 43. The chiller 50 has a function to control the temperature of the cooling water 51 circulating through the heat sink 43 to, for example, an instructed temperature. The temperature instruction to the chiller 50 is performed by, for example, an operator.

The first wavelength selection mirror 44 transmits the excitation light Le1 emitted from the LD 41 and supplies the transmitted light to the laser crystal 42. In addition, the first wavelength selection mirror 44 reflects the laser beam L10 emitted by the laser crystal 42 and propagates the reflected light to the second resonance mirror 47.

The second wavelength selection mirror 45 transmits the transmitted excitation light Le2. In addition, the second wavelength selection mirror 45 reflects the laser beam L10 emitted from the laser crystal 42 and propagates the reflected light to the first resonance mirror 46. In addition, the second wavelength selection mirror 45 reflects the laser reflected light from the first resonance mirror 46 and propagates the reflected light to the laser crystal 42.

The LD 41 performs laser oscillation by injection current supplied from a power source which is not illustrated and supplies the energy of its output light as the excitation light Le1 to the laser crystal 42, thereby exciting the laser crystal 42.

The laser crystal 42 is excited by the excitation light Le1 from the LD 41, and the gain thereof increases at a predetermined wavelength. The solid-state laser 40 performs laser oscillation when the gain of the laser crystal 42 increases at the predetermined wavelength and exceeds a loss in a resonator of the first resonance mirror 46 and the second resonance mirror 47. As a result, the solid-state laser 40 outputs the laser beam L10 from any one or both of the second resonance mirror 47 and the first resonance mirror 46.

The transmitted excitation light Le2 having transmitted through the second wavelength selection mirror 45 is absorbed by a damper which is not illustrated or the like.

2.3 Problem

Figures 3, 4:
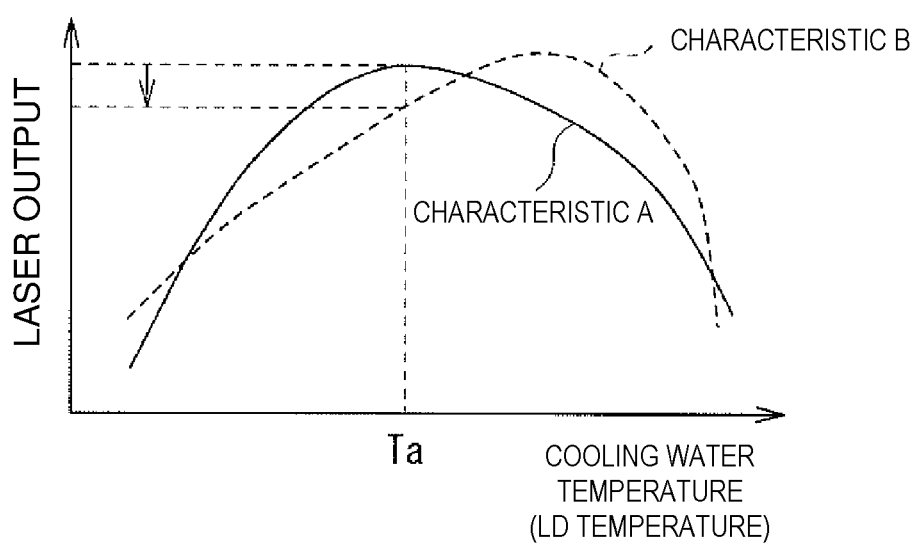
FIG. 3 schematically illustrates an exemplary qualitative relation, in the laser apparatus according to the comparative example, among the temperature of cooling water, the wavelength of excitation light, the absorption coefficient of a laser crystal, the gain of a resonator, and the laser output.
FIG. 4 schematically illustrates an exemplary relation between the temperature of the cooling water and the laser output in the laser apparatus according to the comparative example.

FIG. 3 schematically illustrates an exemplary qualitative relation, in the laser apparatus 301 according to the comparative example, among the temperature of the cooling water 51, the wavelength of the excitation light Le1 emitted by the LD 41, the absorption coefficient of the laser crystal 42, the gain of the resonator, and the laser output. FIG. 4 schematically illustrates an exemplary relation between the temperature of the cooling water 51 and the laser output in the laser apparatus 301 according to the comparative example. In FIG. 4, the horizontal axis represents the temperature of the cooling water 51 or the LD 41, and the vertical axis represents the laser output.

Typically, the wavelength of the LD 41 shifts to a long wavelength side as the environment temperature increases, or shifts to a short wavelength side as the environment temperature decreases. In addition, the carrier density at laser oscillation increases as oscillation threshold current increases due to degradation of the LD 41. Thus, due to the plasma effect, the refractive index in the LD 41 decreases and the oscillation wavelength becomes shorter in some cases.

In addition, heat conduction changes in some case due to temporal change in the state of a flow path through which the cooling water 51 circulates. In such a case, even when the cooling water 51 is controlled to a constant temperature, the temperature of the LD 41 changes and the wavelength of the excitation light Le1 emitted by the LD 41 changes in some cases.

The absorption coefficient of the laser crystal 42 for the excitation light Le1 changes with the wavelength, and there is an optimum wavelength for maximally absorbing the excitation light Le1. Thus, the absorption amount of the excitation light Le1 at the laser crystal 42 changes and the excitation amount changes as the wavelength of the LD 41 changes due to degradation of the LD 41 and temporal degradation of the flow path of the cooling water 51. As a result, the gain of the resonator in the solid-state laser 40 changes and the laser output value changes.

For example, when the wavelength of the excitation light Le1 emitted by the LD 41 changes due to temporal change while the temperature of the cooling water 51 is controlled to a constant temperature Ta in FIG. 4, the characteristic of the laser output against the temperature changes from characteristic A to characteristic B and the laser output decreases. The laser output decreases through temporal change such as this characteristic change of the LD 41 as well as change of the heat-releasing characteristic of the heat sink 43 or the like.

<3. Embodiment 1> (Laser Apparatus Including Monitor Device)

The following describes a laser apparatus according to Embodiment 1 of the present disclosure. In the following description, a component substantially same as that of the laser apparatus according to the comparative example is denoted by the same reference sign, and description thereof is omitted as appropriate.

3.1 Configuration

Figure 5:
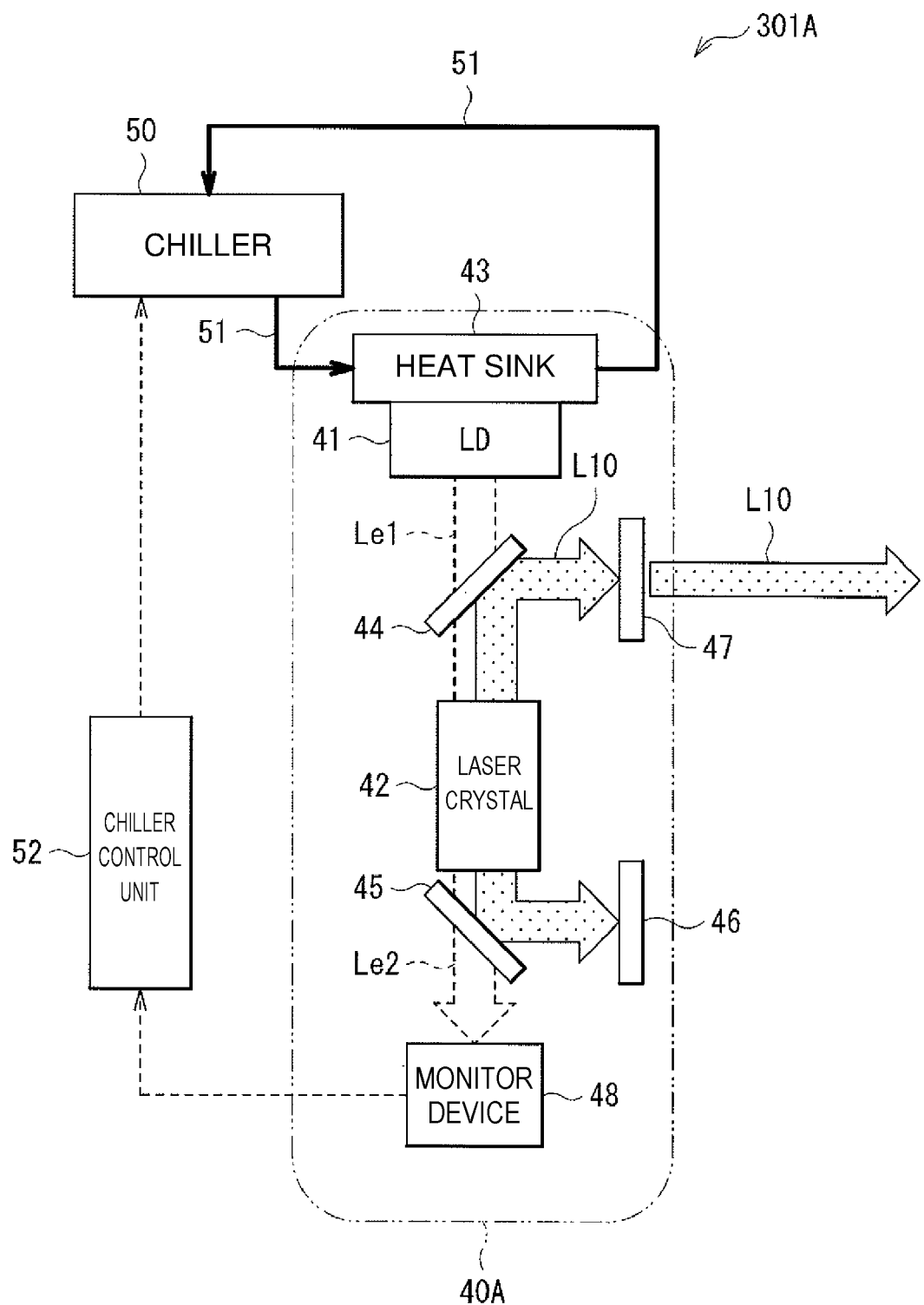
FIG. 5 schematically illustrates an exemplary configuration of a laser apparatus according to Embodiment 1.

FIG. 5 schematically illustrates an exemplary configuration of a laser apparatus 301A according to Embodiment 1. In the following, any configuration different from that of the laser apparatus 301 according to the comparative example illustrated in FIG. 2 will be mainly described.

The laser apparatus 301A includes a solid-state laser 40A, the chiller 50, and a chiller control unit 52.

The solid-state laser 40A is a laser oscillator configured to output the laser beam L10 generated when the excitation light Le1 is incident on the laser crystal 42. The solid-state laser 40A includes a monitor device 48 in addition to the configuration of the solid-state laser 40 in the comparative example in FIG. 2.

The second wavelength selection mirror 45 has a wavelength selection function to separate the transmitted excitation light Le2 having transmitted through the laser crystal 42 and the laser beam L10. The second wavelength selection mirror 45 is disposed on the optical path of the transmitted excitation light Le2 between a laser crystal 42 and the monitor device 48 to transmit the transmitted excitation light Le2 toward the monitor device 48. The second wavelength selection mirror 45 reflects the laser beam L10 generated by the laser crystal 45 toward the first resonance mirror 46. Alternatively, the second wavelength selection mirror 45 may reflect the transmitted excitation light Le2 toward the monitor device 48 and transmit the laser beam L10 toward the first resonance mirror 46.

The monitor device 48 is disposed on the optical path of the transmitted excitation light Le2 after having transmitted through the laser crystal 42. The monitor device 48 corresponds to a first monitor device configured to monitor the transmitted excitation light Le2. The monitor device 48 measures a physical quantity of the transmitted excitation light Le2. The monitor device 48 is connected with the chiller control unit 52.

The chiller 50 is connected with the chiller control unit 52. The chiller 50 is a temperature adjustment device configured to adjust the temperature of the LD 41 as an excitation light source to a constant temperature based on a temperature command value from the chiller control unit 52. The temperature command value specifies the temperature of the cooling water 51.

The chiller control unit 52 is connected with the monitor device 48 and the chiller 50. The chiller control unit 52 is a controller configured to change the temperature command value to the chiller 50 based on a result of monitoring by the monitor device 48.

3.2 Operation

In the laser apparatus 301A according to Embodiment 1, the transmitted excitation light Le2 having transmitted through the laser crystal 42 is incident on the monitor device 48 through the second wavelength selection mirror 45. The monitor device 48 monitors a physical quantity of the transmitted excitation light Le2 and converts the physical quantity into a monitor signal. The monitor device 48 transmits the monitor signal to the chiller control unit 52.

The chiller control unit 52 changes the temperature command value to the chiller 50 when the monitor signal from the monitor device 48 has changed. The chiller 50 controls the temperature of the cooling water 51 supplied to the heat sink 43 in the solid-state laser 40A based on the temperature command value from the chiller control unit 52.

The chiller 50 controls the LD 41 to a desired temperature by controlling the temperature of the cooling water 51 circulating through the heat sink 43 to the temperature specified by the temperature command value.

(Numerical Example of Control Range)

The following describes an example in which the physical quantity monitored by the monitor device 48 is wavelength and a temperature Ta of the cooling water 51 at the chiller 50 is controlled so that the excitation light Le1 emitted by the LD 41 has a wavelength in a desired range.

For example, when the laser crystal 42 is $YVO_4$ and the excitation light Le1 has a wavelength in the band of 880 nm, the absorption band of the laser crystal 42 has a wavelength range of, for example, 880 nm±1.5 nm. The concentration of dopant Nd ions in the laser crystal 42 is, for example, 3% approximately.

When the absorption band of the laser crystal 42 has the above-described wavelength range, control is preferably performed to set the central wavelength of the excitation light Le1 emitted by the LD 41 to be 880 nm±1.5 nm. The spectrum width is the full width at half maximum (FWHM).

Typically, the wavelength of the LD 41 has temperature dependency of 0.3 nm/° C. approximately. The control range of the temperature Ta of the cooling water 51 is within, for example, ±5° C.

The other configuration and operation may be substantially same as those of the laser apparatus 301 according to the comparative example.

3.3 Action/Effect

The physical quantity of the transmitted excitation light Le2 having transmitted through the laser crystal 42 changes as the wavelength of the excitation light Le1 emitted by the LD 41 changes due to temporal change. When the physical quantity of the transmitted excitation light Le2 having transmitted through the laser crystal 42 has changed, the current temperature command value specified to the chiller 50 is highly likely to be inappropriate. Thus, the temperature command value to the chiller 50 is changed based on a result of monitoring by the monitor device 48, thereby avoiding laser output decrease due to temporal change.

With the laser apparatus 301A according to Embodiment 1, since the physical quantity of the transmitted excitation light Le2 having transmitted through the laser crystal 42 is monitored, the capability of determining the wavelength and gain of the excitation light Le1 actually used for excitation can be enhanced as compared to a case in which the physical quantity of the excitation light Le1 before incident on the laser crystal 42 is monitored. In addition, it is possible to reduce a loss of the laser beam L10 as compared to a case in which the laser beam L10 output from the solid-state laser 40A is monitored.

<4. Embodiment 2> (Laser Apparatus Including Power Monitor)

The following describes a laser apparatus according to Embodiment 2 of the present disclosure. In the following description, a component substantially same as that of the laser apparatus according to the comparative example or Embodiment 1 is denoted by the same reference sign, and description thereof is omitted as appropriate.

4.1 Configuration

Figure 6:
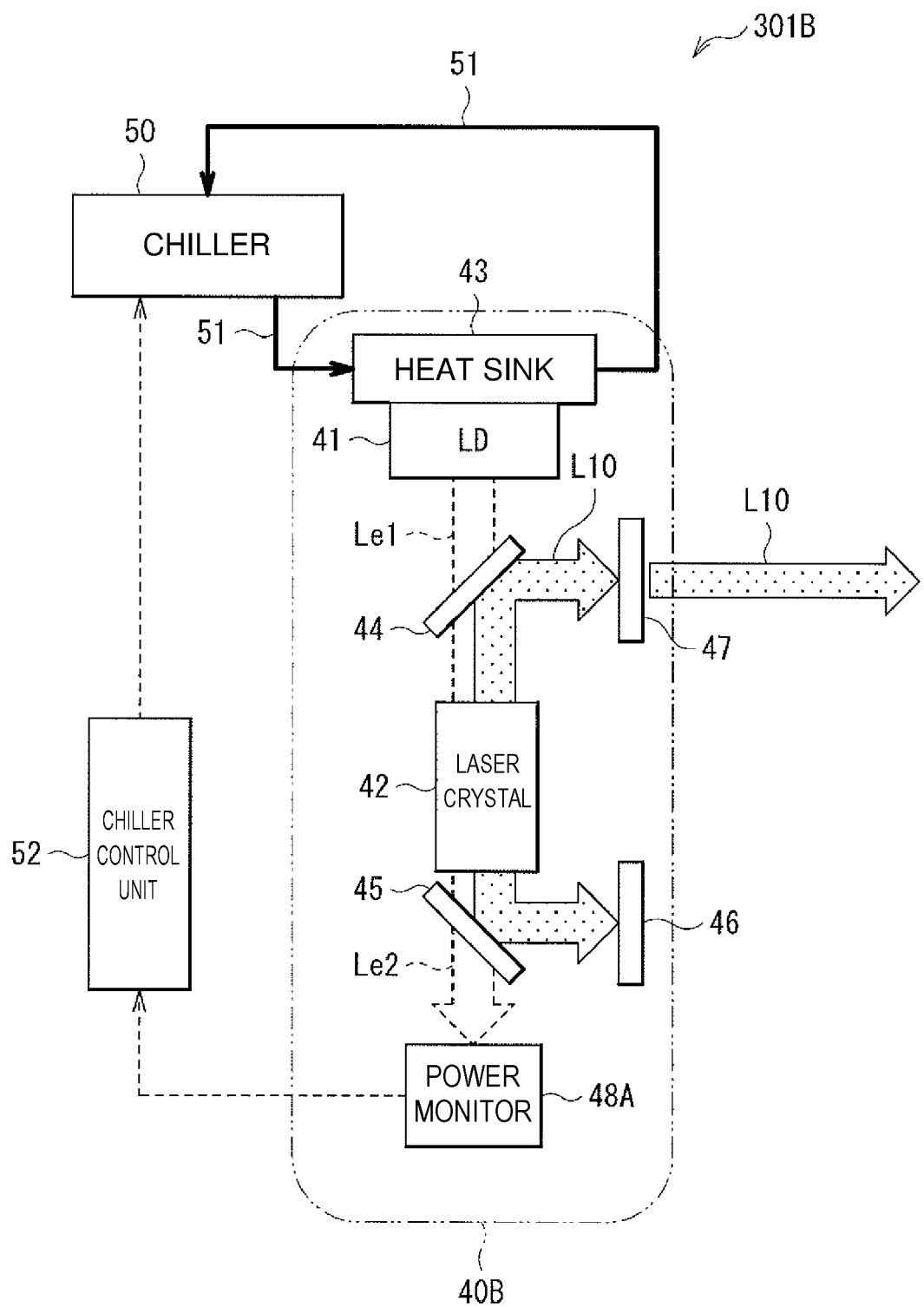
FIG. 6 schematically illustrates an exemplary configuration of a laser apparatus according to Embodiment 2.

FIG. 6 schematically illustrates an exemplary configuration of a laser apparatus 301B according to Embodiment 2. In the following, any configuration different from that of the laser apparatus 301A according to Embodiment 1 illustrated in FIG. 5 will be mainly described.

The laser apparatus 301B includes a solid-state laser 40B, the chiller 50, and the chiller control unit 52.

The solid-state laser 40B is a laser oscillator configured to output the laser beam L10 generated when the excitation light Le1 is incident on the laser crystal 42. The solid-state laser 40B includes a power monitor 48A as the monitor device 48 in Embodiment 1 in FIG. 5.

The power monitor 48A is disposed on the optical path of the transmitted excitation light Le2 after having transmitted through the laser crystal 42. The power monitor 48A corresponds to the first monitor device configured to monitor the transmitted excitation light Le2. The power monitor 48A measures power as the physical quantity of the transmitted excitation light Le2. The power monitor 48A is connected with the chiller control unit 52. The power monitor 48A includes any one or a plurality of a photodiode sensor, a thermal sensor, a pyroelectric sensor, an integrating sphere sensor, an illuminometer, and a radiometer. Instead, the power monitor 48A may be configured as a monitor device configured to measure the intensity or energy of the transmitted excitation light Le2 having transmitted through the laser crystal 42.

The chiller control unit 52 is connected with the power monitor 48A and the chiller 50. The chiller control unit 52 is a controller configured to change the temperature command value to the chiller 50 based on a result of monitoring by the power monitor 48A.

4.2 Operation

In the laser apparatus 301B according to Embodiment 2, the transmitted excitation light Le2 having transmitted through the laser crystal 42 is incident on the power monitor 48A through the second wavelength selection mirror 45. The power monitor 48A monitors the power of the transmitted excitation light Le2 and converts the power into a monitor signal. The power monitor 48A transmits the monitor signal to the chiller control unit 52.

The power of the transmitted excitation light Le2 having transmitted through the laser crystal 42 is minimum when the wavelength of the excitation light Le1 is equal to a wavelength at which the absorption coefficient of the laser crystal 42 is maximum. In this case, the gain of the laser output is maximum and the output value is maximum in the solid-state laser 40B. The power of the transmitted excitation light Le2 having transmitted through the laser crystal 42 increases as the excitation light Le1 shifts to a wavelength at which the absorption coefficient is smaller. In this case, the gain of the laser output decreases and the output value decreases in the solid-state laser 40B.

The chiller control unit 52 changes the temperature command value to the chiller 50 based on the monitor signal from the power monitor 48A so that the power of the transmitted excitation light Le2 decreases, preferably becomes minimum.

The chiller 50 controls the LD 41 to a desired temperature by controlling the temperature of the cooling water 51 circulating through the heat sink 43 to the temperature specified by the temperature command value.

The other configuration and operation may be substantially same as those of the laser apparatus according to the comparative example or Embodiment 1.

4.3 Action/Effect

With the laser apparatus 301B according to Embodiment 2, the current temperature command value specified to the chiller 50 is changed so that the power of the transmitted excitation light Le2 having transmitted through the laser crystal 42 decreases when the power has increased. Accordingly, decrease of the laser output from the solid-state laser 40B due to temporal change can be reduced. With the laser apparatus 301B according to Embodiment 2, the power can be monitored by the power monitor 48A with a relatively simple configuration, and thus an inexpensive and compact configuration of the apparatus can be achieved.

<5. Embodiment 3> (Laser Apparatus Including Wavelength Monitor)

The following describes a laser apparatus according to Embodiment 3 of the present disclosure. In the following description, a component substantially same as that of the laser apparatus according to the comparative example or Embodiment 1 or 2 is denoted by the same reference sign, and description thereof is omitted as appropriate.

5.1 Configuration

Figure 7:
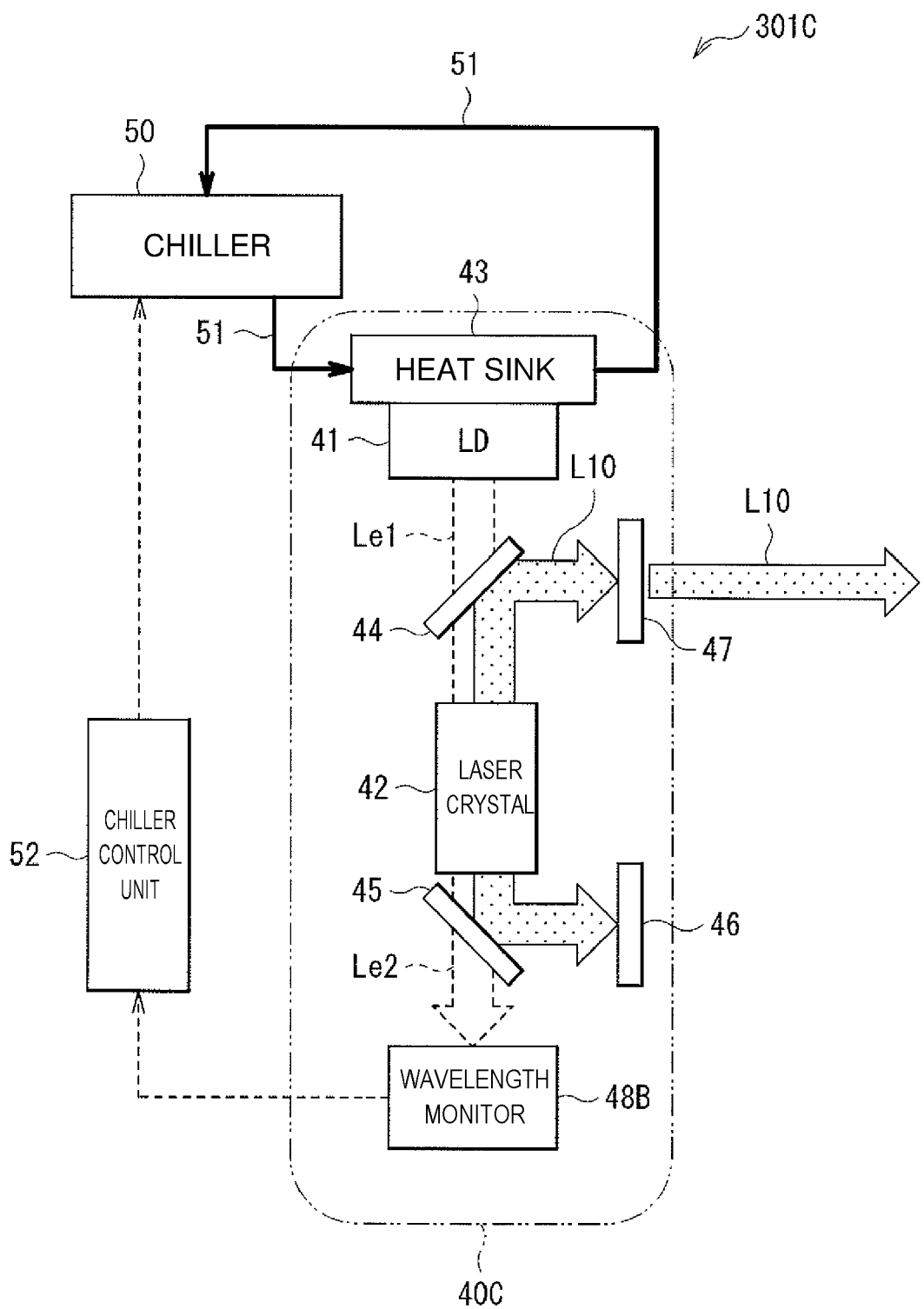
FIG. 7 schematically illustrates an exemplary configuration of a laser apparatus according to Embodiment 3.

FIG. 7 schematically illustrates an exemplary configuration of a laser apparatus 301C according to Embodiment 3. In the following, any configuration different from that of the laser apparatus 301A according to Embodiment 1 illustrated in FIG. 5 will be mainly described.

The laser apparatus 301C includes a solid-state laser 40C, the chiller 50, and the chiller control unit 52.

The solid-state laser 40C is a laser oscillator configured to output the laser beam L10 generated when the excitation light Le1 is incident on the laser crystal 42. The solid-state laser 40C includes a wavelength monitor 48B as the monitor device 48 in Embodiment 1 in FIG. 5.

The wavelength monitor 48B is disposed on the optical path of the transmitted excitation light Le2 after having transmitted through the laser crystal 42. The wavelength monitor 48B corresponds to the first monitor device configured to monitor the transmitted excitation light Le2. The wavelength monitor 48B measures wavelength as the physical quantity of the transmitted excitation light Le2. The wavelength monitor 48B is configured by various kinds of interferometers such as a Michelson interferometer, a Fizeau interferometer, a Fabry-Perot interferometer, and an optical heterodyne interferometer. Alternatively, the wavelength monitor 48B may be a spectrum analyzer or a spectrometer. The spectrum analyzer and the spectrometer may be a monochromator or a polychromator including a diffraction grating and a prism.

The chiller control unit 52 is connected with the wavelength monitor 48B and the chiller 50. The chiller control unit 52 is a controller configured to change the temperature command value to the chiller 50 based on a result of monitoring by the wavelength monitor 48B.

5.2 Operation

In the laser apparatus 301C according to Embodiment 3, the transmitted excitation light Le2 having transmitted through the laser crystal 42 is incident on the wavelength monitor 48B through the second wavelength selection mirror 45. The wavelength monitor 48B monitors the wavelength of the transmitted excitation light Le2 and converts the wavelength into a monitor signal. The wavelength monitor 48B transmits the monitor signal to the chiller control unit 52.

The chiller control unit 52 changes the temperature command value to the chiller 50 so that the monitored wavelength of the transmitted excitation light Le2 becomes equal to a desired wavelength. The desired wavelength is a wavelength at which the absorption amount of the excitation light Le1 in the laser crystal 42, in other words, the absorption coefficient thereof is maximum. The wavelength at which the absorption coefficient of the laser crystal 42 is maximum may be, for example, 880 nm when the laser crystal 42 is $YVO_4$.

The other configuration and operation may be substantially same as those of the laser apparatus according to the comparative example or Embodiment 1.

5.3 Action/Effect

With the laser apparatus 301C according to Embodiment 3, the current temperature command value specified to the chiller 50 is changed so that the wavelength of the transmitted excitation light Le2 having transmitted through the laser crystal 42 becomes a wavelength at which the absorption coefficient is large when the wavelength has shifted from a wavelength at which the absorption coefficient is large. Accordingly, decrease of the laser output from the solid-state laser 40C due to temporal change can be reduced. The configuration may be relatively complicated when the wavelength is to be monitored, the monitored wavelength can be highly accurately matched with the absorption wavelength of the laser crystal 42. Thus, the laser output can be constantly maintained high.

<6. Embodiment 4> (First Exemplary Laser Apparatus Including Amplifier)

The following describes a laser apparatus according to Embodiment 4 of the present disclosure. In the following description, a component substantially same as that of the laser apparatus according to the comparative example or any of Embodiments 1 to 3 is denoted by the same reference sign, and description thereof is omitted as appropriate.

6.1 Configuration

Figure 8:
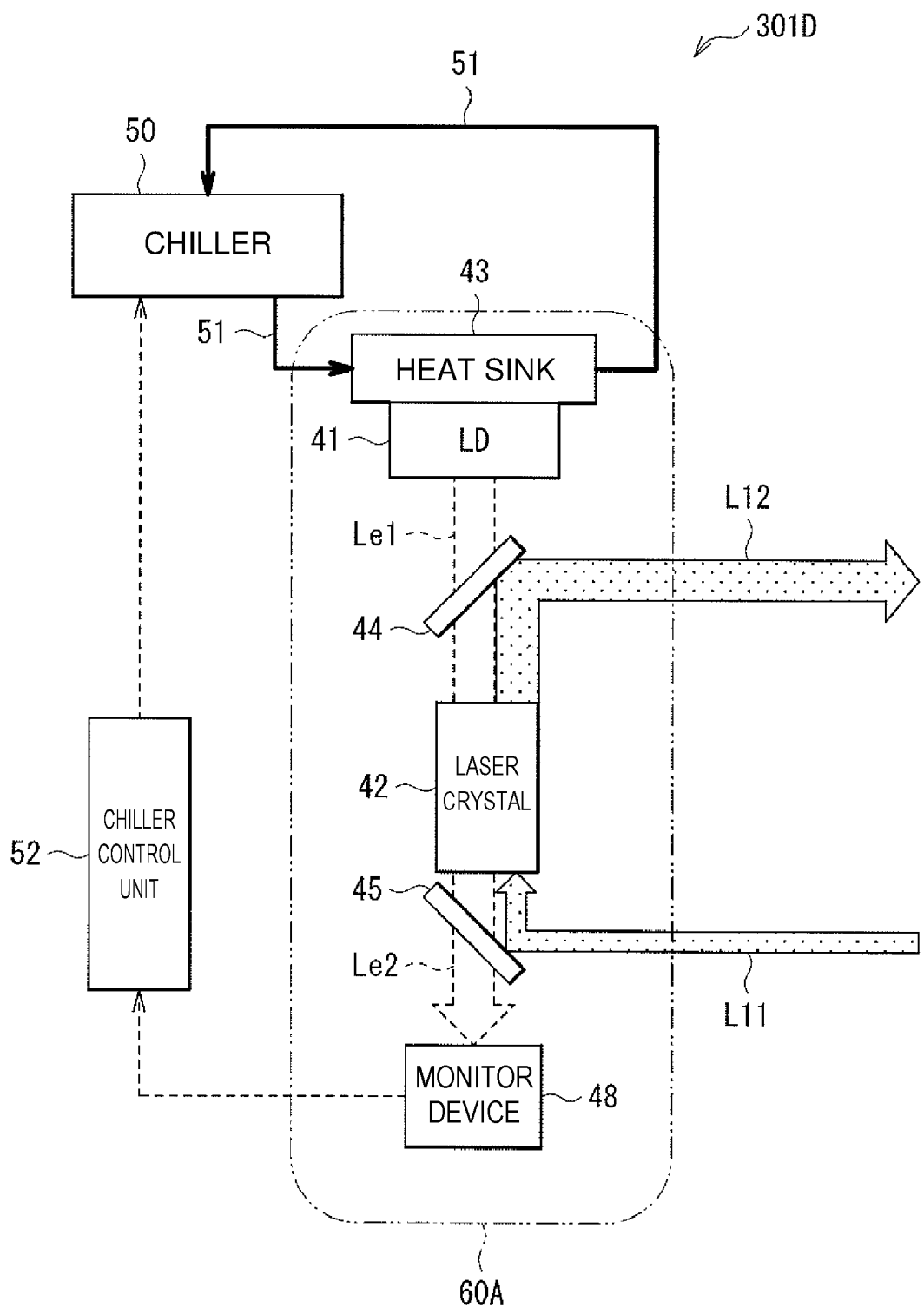
FIG. 8 schematically illustrates an exemplary configuration of a laser apparatus according to Embodiment 4.

FIG. 8 schematically illustrates an exemplary configuration of a laser apparatus 301D according to Embodiment 4. In the following, any configuration different from that of the laser apparatus 301A according to Embodiment 1 illustrated in FIG. 5 will be mainly described.

Although the laser apparatus 301A according to Embodiment 1 includes the solid-state laser 40A as a laser oscillator, the laser apparatus 301D according to Embodiment 4 includes a solid-state laser amplifier 60A as an optical amplification device in place of the solid-state laser 40A.

The solid-state laser amplifier 60A may not include the first resonance mirror 46 and the second resonance mirror 47 in the configuration of the solid-state laser 40A in Embodiment 1.

In the solid-state laser amplifier 60A, the excitation light Le1 from the LD 41 is incident on the laser crystal 42 through the first wavelength selection mirror 44. In addition, an input laser beam L11 to be amplified by the excitation light Le1 is incident on the laser crystal 42 through the second wavelength selection mirror 45. The excitation light Le1 and the input laser beam L11 are incident on the laser crystal 42 in directions (facing directions) opposite to each other.

In the solid-state laser amplifier 60A, the first wavelength selection mirror 44 separates the optical path of the excitation light Le1 from the LD 41 and the optical path of an amplified laser beam L12 output from the laser crystal 42.

In the solid-state laser amplifier 60A, the second wavelength selection mirror 45 aligns the optical path of the transmitted excitation light Le2 from the laser crystal 42 and the optical path of the input laser beam L11 input to the solid-state laser amplifier 60A with each other.

Similarly to the solid-state laser 40A in Embodiment 1, the solid-state laser amplifier 60A includes the monitor device 48 configured to measure a physical quantity of the transmitted excitation light Le2.

6.2 Operation

In the laser apparatus 301D according to Embodiment 4, the transmitted excitation light Le2 having transmitted through the laser crystal 42 is incident on the monitor device 48 through the second wavelength selection mirror 45. The monitor device 48 monitors a physical quantity of the transmitted excitation light Le2 and converts the physical quantity into a monitor signal. The monitor device 48 transmits the monitor signal to the chiller control unit 52.

The second wavelength selection mirror 45 has a wavelength selection function to transmit the transmitted excitation light Le2 toward the monitor device 48 and reflect the input laser beam L11 toward the laser crystal 42. Alternatively, the second wavelength selection mirror 45 may reflect the transmitted excitation light Le2 toward the monitor device 48 and transmit the input laser beam L11 toward the laser crystal 42.

The chiller 50 controls the temperature of the cooling water 51 supplied to the heat sink 43 in the solid-state laser amplifier 60A based on the temperature command value from the chiller control unit 52. The chiller 50 controls the LD 41 to a desired temperature by controlling the temperature of the cooling water 51 circulating through the heat sink 43 to the temperature specified by the temperature command value.

The gain of the laser crystal 42 increases at a predetermined wavelength through excitation by the excitation light Le1 from the LD 41. Part of the excitation light Le1 transmits through the laser crystal 42. The gain of the laser crystal 42 increases at the predetermined wavelength, and the laser crystal 42 amplifies the input laser beam L11 input at the wavelength and propagates the amplified input laser beam L11 to the first wavelength selection mirror 44 as the amplified laser beam L12.

The first wavelength selection mirror 44 has a wavelength selection function to transmit the excitation light Le1 toward the laser crystal 42 and reflect the amplified laser beam L12 from the laser crystal 42 as output light from the solid-state laser amplifier 60A. Alternatively, the first wavelength selection mirror 44 may reflect the excitation light Le1 toward the laser crystal 42 and transmit the amplified laser beam L12 as output light from the solid-state laser amplifier 60A.

The other configuration and operation may be substantially same as those of the laser apparatus according to the comparative example or Embodiment 1.

Similarly to the laser apparatus 301B according to Embodiment 2, the laser apparatus 301D according to Embodiment 4 may include the power monitor 48A in place of the monitor device 48. In addition, similarly to the laser apparatus 301C according to Embodiment 3, the laser apparatus 301D according to Embodiment 4 may include the wavelength monitor 48B in place of the monitor device 48.

6.3 Action/Effect

With the laser apparatus 301D according to Embodiment 4, decrease of the laser output from an optical amplification device along with temporal change can be reduced.

With the laser apparatus 301D according to Embodiment 4, the traveling direction of the input laser beam L11 and the amplified laser beam L12 to the laser crystal 42 is opposite to the traveling direction of the excitation light Le1. However, with a laser apparatus 301E according to Embodiment 5 to be described later, the traveling direction of the input laser beam L11 and the amplified laser beam L12 is identical to the traveling direction of the excitation light Le1. When the traveling direction of the input laser beam L11 and the amplified laser beam L12 is opposite to the traveling direction of the excitation light Le1, high laser output is likely to be obtained as compared to a case in which the traveling directions are identical to each other. This is because the power of the input laser beam L11 input into the laser crystal 42 increases as the position moves from the incident position to the emission position, and thus the gain of the laser crystal 42 on the emission position side is likely to decrease. When the excitation light Le1 is incident on the laser crystal 42 from the emission position side of the input laser beam L11, the excitation amount of the laser crystal 42 increases on the emission position side of the input laser beam L11 and decreases on the incident position side of the input laser beam L11. Thus, gain decrease on the emission position side of the input laser beam L11 can be reduced and high laser output is likely to be obtained.

7. Embodiment 5 (Second Exemplary Laser Apparatus Including Amplifier)

The following describes a laser apparatus according to Embodiment 5 of the present disclosure. In the following description, a component substantially same as that of the laser apparatus according to the comparative example or any of Embodiments 1 to 4 is denoted by the same reference sign, and description thereof is omitted as appropriate.

7.1 Configuration

Figure 9:
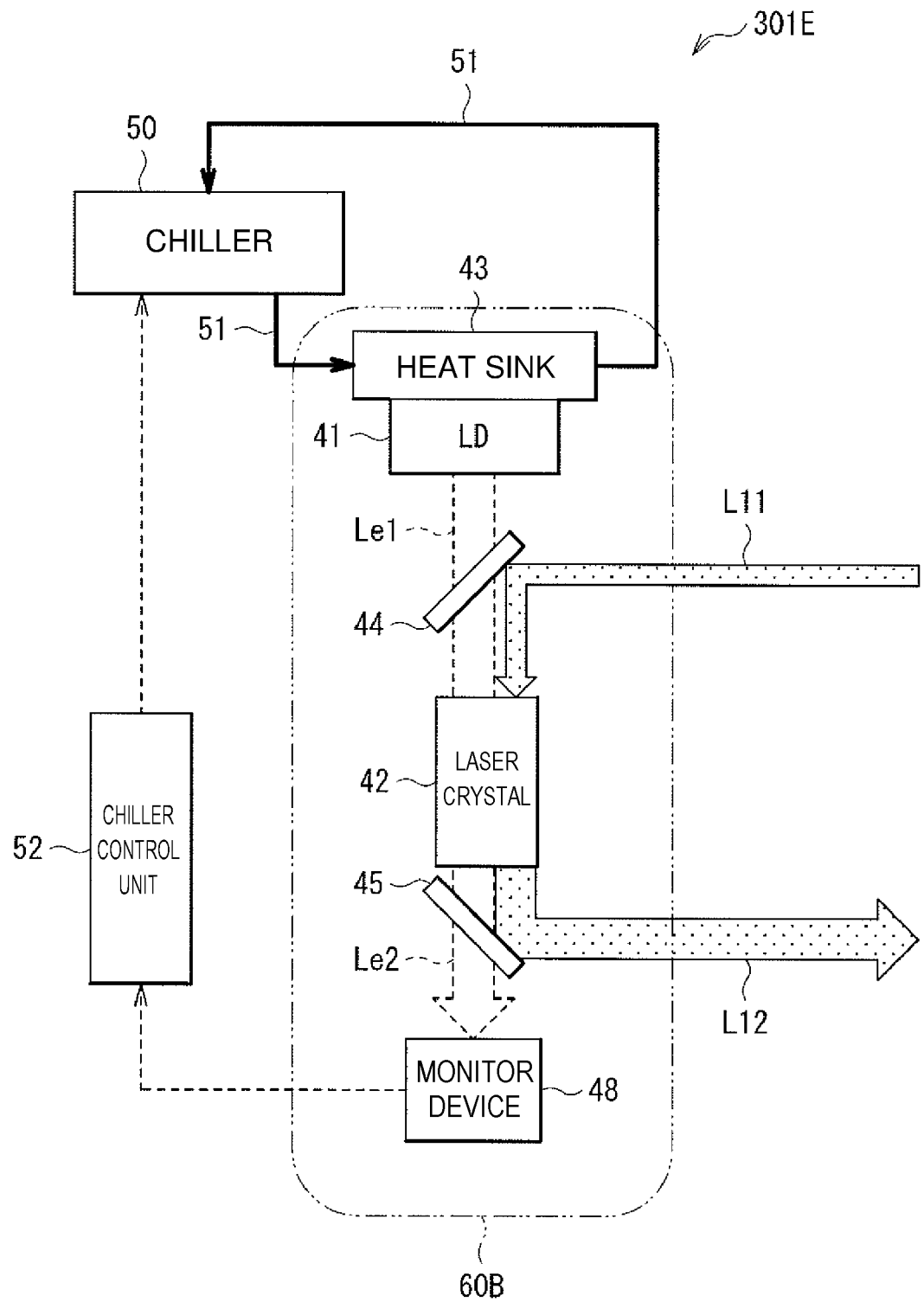
FIG. 9 schematically illustrates an exemplary configuration of a laser apparatus according to Embodiment 5.

FIG. 9 schematically illustrates an exemplary configuration of the laser apparatus 301E according to Embodiment 5. In the following, any configuration different from that of the laser apparatus 301A according to Embodiment 1 illustrated in FIG. 5 will be mainly described.

Although the laser apparatus 301A according to Embodiment 1 includes the solid-state laser 40A as a laser oscillator, the laser apparatus 301E according to Embodiment 5 includes a solid-state laser amplifier 60B as an optical amplification device in place of the solid-state laser 40A.

The solid-state laser amplifier 60B may not include the first resonance mirror 46 and the second resonance mirror 47 in the configuration of the solid-state laser 40A in Embodiment 1.

In the solid-state laser amplifier 60B, the excitation light Le1 from the LD 41 is incident on the laser crystal 42 through the first wavelength selection mirror 44. In addition, the input laser beam L11 to be amplified by the excitation light Le1 is incident on the laser crystal 42 through the first wavelength selection mirror 44. The excitation light Le1 and the input laser beam L11 are incident on the laser crystal 42 in directions identical to each other.

In the solid-state laser amplifier 60B, the first wavelength selection mirror 44 aligns the optical path of the excitation light Le1 from the LD 41 and the optical path of the input laser beam L11 input to the solid-state laser amplifier 60B with each other.

In the solid-state laser amplifier 60B, the second wavelength selection mirror 45 separates the optical path of the transmitted excitation light Le2 from the laser crystal 42 and the optical path of the amplified laser beam L12.

Similarly to the solid-state laser 40A in Embodiment 1, the solid-state laser amplifier 60B includes the monitor device 48 configured to measure a physical quantity of the transmitted excitation light Le2.

7.2 Operation

In the laser apparatus 301E according to Embodiment 5, the transmitted excitation light Le2 having transmitted through the laser crystal 42 is incident on the monitor device 48 through the second wavelength selection mirror 45. The monitor device 48 monitors a physical quantity of the transmitted excitation light Le2 and converts the physical quantity into a monitor signal. The monitor device 48 transmits the monitor signal to the chiller control unit 52.

The second wavelength selection mirror 45 has a wavelength selection function to transmit the transmitted excitation light Le2 toward the monitor device 48 and reflect the amplified laser beam L12 from the laser crystal 42 as output light from the solid-state laser amplifier 60B. Alternatively, the second wavelength selection mirror 45 may reflect the transmitted excitation light Le2 toward the monitor device 48 and transmit the amplified laser beam L12 as output light from the solid-state laser amplifier 60B.

The chiller 50 controls the temperature of the cooling water 51 supplied to the heat sink 43 in the solid-state laser amplifier 60B based on the temperature command value from the chiller control unit 52. The chiller 50 controls the LD 41 to a desired temperature by controlling the temperature of the cooling water 51 circulating through the heat sink 43 to the temperature specified by the temperature command value.

The gain of the laser crystal 42 increases at a predetermined wavelength through excitation by the excitation light Le2 from the LD 41. Part of the excitation light Le1 transmits through the laser crystal 42. The gain of the laser crystal 42 increases at the predetermined wavelength, and the laser crystal 42 amplifies the input laser beam L11 input at the wavelength and propagates the amplified input laser beam L11 to the second wavelength selection mirror 45 as the amplified laser beam L12.

The first wavelength selection mirror 44 has a wavelength selection function to transmit the excitation light Le2 toward the laser crystal 42 and reflect the input laser beam L11 toward the laser crystal 42. Alternatively, the first wavelength selection mirror 44 may reflect the excitation light Le2 toward the laser crystal 42 and transmit the input laser beam L11 toward the laser crystal 42.

The other configuration and operation may be substantially same as those of the laser apparatus according to the comparative example or Embodiment 1.

Similarly to the laser apparatus 301B according to Embodiment 2, the laser apparatus 301E according to Embodiment 5 may include the power monitor 48A in place of the monitor device 48. In addition, similarly to the laser apparatus 301C according to Embodiment 3, the laser apparatus 301E according to Embodiment 5 may include the wavelength monitor 48B in place of the monitor device 48.

7.3 Action/Effect

With the laser apparatus 301E according to Embodiment 5, the traveling direction of the input laser beam L11 and the amplified laser beam L12 to the laser crystal 42 is identical to the traveling direction of the excitation light Le1. With this configuration, the laser output with low noise can be obtained as compared to a case in which the traveling direction of the input laser beam L11 and the amplified laser beam L12 to the laser crystal 42 is opposite to the traveling direction of the excitation light Le2 as in the laser apparatus 301D according to Embodiment 4.

8. Embodiment 6 (Third Exemplary Laser Apparatus Including Amplifier)

The following describes a laser apparatus according to Embodiment 6 of the present disclosure. In the following description, a component substantially same as that of the laser apparatus according to the comparative example or any of Embodiments 1 to 5 is denoted by the same reference sign, and description thereof is omitted as appropriate.

8.1 Configuration

Figure 10:
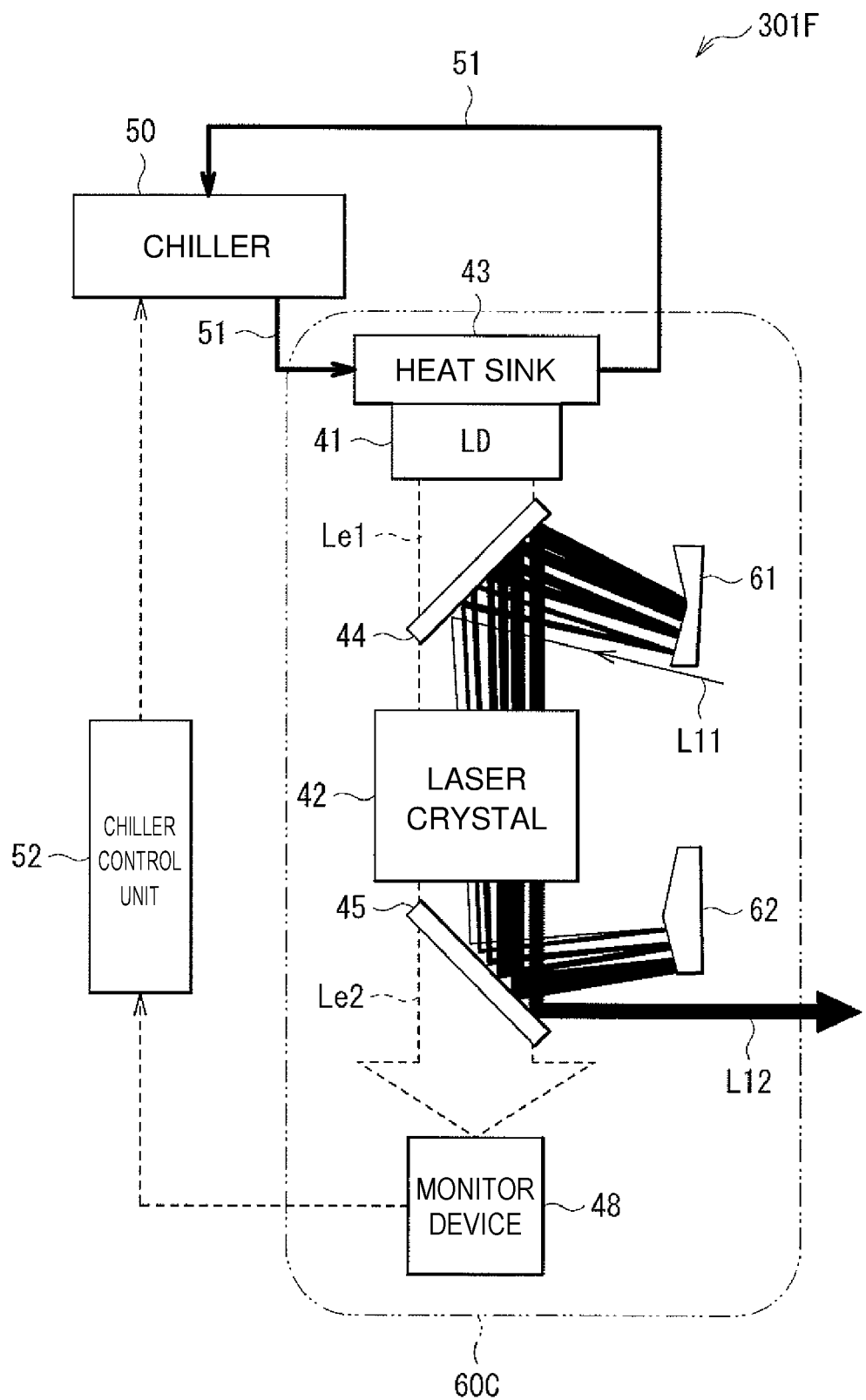
FIG. 10 schematically illustrates an exemplary configuration of a laser apparatus according to Embodiment 6.

FIG. 10 schematically illustrates an exemplary configuration of a laser apparatus 301F according to Embodiment 6. In the following, any configuration different from that of the laser apparatus 301A according to Embodiment 1 illustrated in FIG. 5 will be mainly described.

Although the laser apparatus 301A according to Embodiment 1 includes the solid-state laser 40A as a laser oscillator, the laser apparatus 301F according to Embodiment 6 includes a solid-state laser amplifier 60C as an optical amplification device in place of the solid-state laser 40A.

The solid-state laser amplifier 60C includes multipath mirrors 61 and 62 in place of the first resonance mirror 46 and the second resonance mirror 47 in the configuration of the solid-state laser 40A in Embodiment 1. The multipath mirrors 61 and 62 are mirrors for reciprocating the input laser beam L11 through the laser crystal 42 a plurality of times. In other words, the solid-state laser amplifier 60C is a multipath optical amplification device. The number of multipath mirrors 61 and 62 may be equal to or larger than three.

In the solid-state laser amplifier 60C, the first wavelength selection mirror 44 aligns or separates, depending on the traveling direction of light, the optical paths of the excitation light Le1, the input laser beam L11, and the amplified laser beam L12 amplified through the laser crystal 42.

In the solid-state laser amplifier 60C, the second wavelength selection mirror 45 aligns or separates, depending on the traveling direction of light, the optical paths of the amplified laser beam L12 amplified through the laser crystal 42 and the transmitted excitation light Le2.

8.2 Operation

In the laser apparatus 301F according to Embodiment 6, the transmitted excitation light Le2 having transmitted through the laser crystal 42 is incident on the monitor device 48 through the second wavelength selection mirror 45. The monitor device 48 monitors a physical quantity of the transmitted excitation light Le2 and converts the physical quantity into a monitor signal. The monitor device 48 transmits the monitor signal to the chiller control unit 52.

The second wavelength selection mirror 45 has a wavelength selection function to transmit the transmitted excitation light Le2 toward the monitor device 48 and reflect the amplified laser beam L12 from the laser crystal 42 as output light from the solid-state laser amplifier 60C. In addition, the second wavelength selection mirror 45 reflects the amplified laser beam L12 from the laser crystal 42 toward the multipath mirror 62. In addition, the second wavelength selection mirror 45 causes the amplified laser beam L12 reflected by the multipath mirror 62 to be incident on the laser crystal 42 again. Alternatively, the second wavelength selection mirror 45 may reflect the transmitted excitation light Le2 toward the monitor device 48 and transmit the amplified laser beam L12 as output light from the solid-state laser amplifier 60C.

The chiller 50 controls the temperature of the cooling water 51 supplied to the heat sink 43 in the solid-state laser amplifier 60C based on the temperature command value from the chiller control unit 52. The chiller 50 controls the LD 41 to a desired temperature by controlling the temperature of the cooling water 51 circulating through the heat sink 43 to the temperature specified by the temperature command value.

The gain of the laser crystal 42 increases at a predetermined wavelength through excitation by the excitation light Le2 from the LD 41. Part of the excitation light Le1 transmits through the laser crystal 42. The gain of the laser crystal 42 increases at the predetermined wavelength, and the laser crystal 42 amplifies the input laser beam L11 input at the wavelength and propagates the amplified input laser beam L11 to the second wavelength selection mirror 45 as the amplified laser beam L12.

The first wavelength selection mirror 44 has a wavelength selection function to transmit the excitation light Le2 toward the laser crystal 42 and reflect the input laser beam L11 toward the laser crystal 42. In addition, the first wavelength selection mirror 44 reflects the amplified laser beam L12 from the laser crystal 42 toward the multipath mirror 61. In addition, the first wavelength selection mirror 44 causes the amplified laser beam L12 reflected by the multipath mirror 61 to be incident on the laser crystal 42 again. Alternatively, the first wavelength selection mirror 44 may reflect the excitation light Le2 toward the laser crystal 42 and transmit the input laser beam L11 toward the laser crystal 42. Alternatively, the first wavelength selection mirror 44 may transmit the amplified laser beam L12 from the laser crystal 42 toward the multipath mirror 61.

The input laser beam L11 is amplified in the laser crystal 42 at each passing through the laser crystal 42 once or a plurality of times reflection at the multipath mirrors 61 and 62.

The other configuration and operation may be substantially same as those of the laser apparatus according to the comparative example or Embodiment 1.

Similarly to the laser apparatus 301B according to Embodiment 2, the laser apparatus 301F according to Embodiment 6 may include the power monitor 48A in place of the monitor device 48. In addition, similarly to the laser apparatus 301C according to Embodiment 3, the laser apparatus 301F according to Embodiment 6 may include the wavelength monitor 48B in place of the monitor device 48.

8.3 Action/Effect

With the laser apparatus 301F according to Embodiment 6, since the input laser beam L11 is reciprocated through the laser crystal 42 a plurality of times, higher laser output can be obtained.

<9. Embodiment 7> (Laser Apparatus Including Two Power Monitors)

The following describes a laser apparatus according to Embodiment 7 of the present disclosure. In the following description, a component substantially same as that of the laser apparatus according to the comparative example or any of Embodiments 1 to 6 is denoted by the same reference sign, and description thereof is omitted as appropriate.

9.1 Configuration

Figure 11:
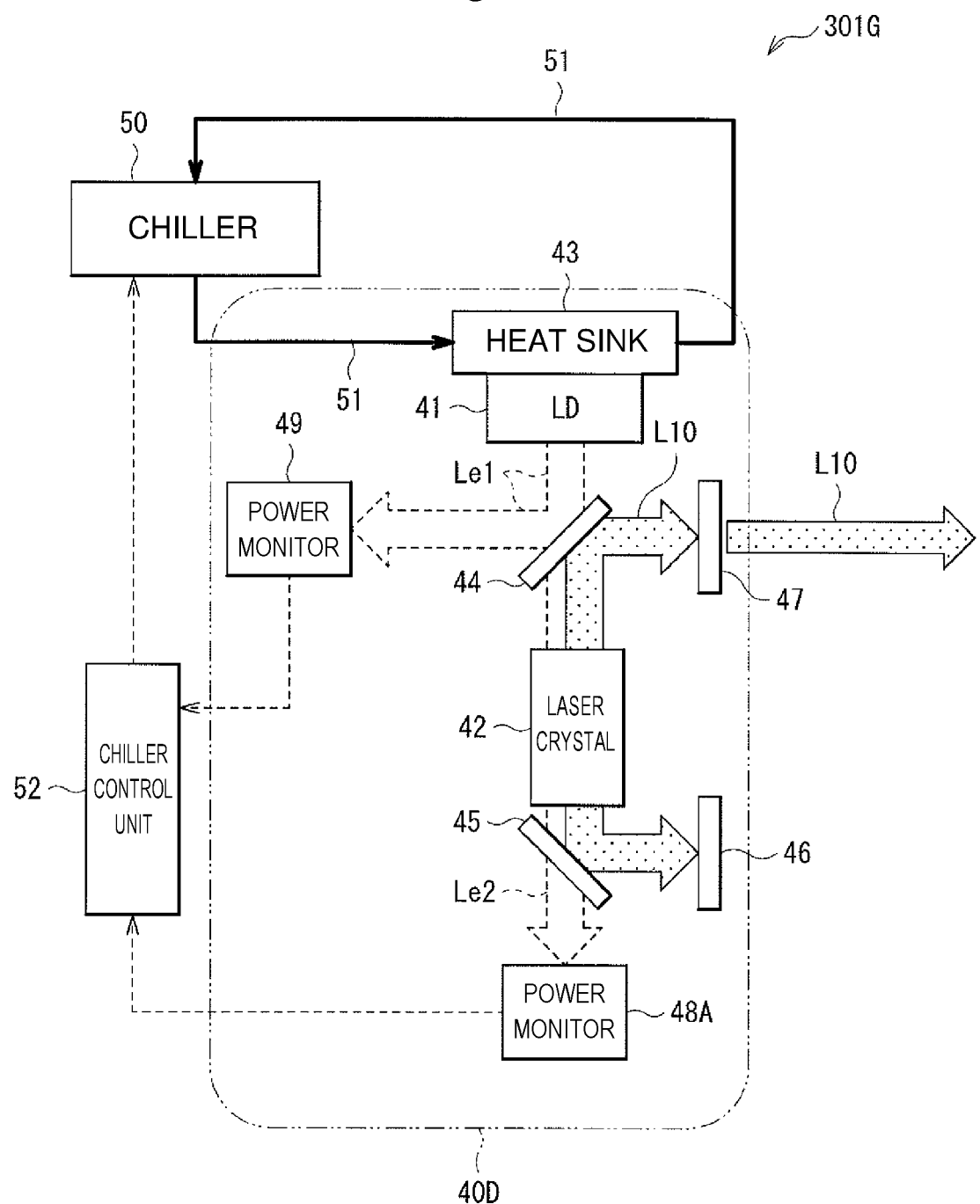
FIG. 11 schematically illustrates an exemplary configuration of a laser apparatus according to Embodiment 7.

FIG. 11 schematically illustrates an exemplary configuration of a laser apparatus 301G according to Embodiment 7. In the following, any configuration different from that of the laser apparatus 301A according to Embodiment 1 illustrated in FIG. 5 will be mainly described.

The laser apparatus 301G includes a solid-state laser 40D, the chiller 50, and the chiller control unit 52.

The solid-state laser 40D is a laser oscillator configured to output the laser beam L10 generated when the excitation light Le1 is incident on the laser crystal 42. The solid-state laser 40D includes the power monitor 48A as the monitor device 48 in Embodiment 1 in FIG. 5.

The power monitor 48A is disposed on the optical path of the transmitted excitation light Le2 after having transmitted through the laser crystal 42. The power monitor 48A corresponds to the first monitor device configured to monitor the transmitted excitation light Le2. The power monitor 48A measures power as the physical quantity of the transmitted excitation light Le2. The power monitor 48A is connected with the chiller control unit 52.

The solid-state laser 40D also includes a power monitor 49. The power monitor 49 is disposed on the optical path of the excitation light Le1. The power monitor 49 corresponds to a second monitor device configured to monitor the excitation light Le1 before transmitting through the laser crystal 42.

The power monitor 48A and the power monitor 49 each include any one or a plurality of a photodiode sensor, a thermal sensor, a pyroelectric sensor, an integrating sphere sensor, an illuminometer, and a radiometer. Instead, the power monitor 48A may be configured as a monitor device configured to measure the intensity or energy of the transmitted excitation light Le2 having transmitted through the laser crystal 42. Similarly, the power monitor 49 may be configured as a monitor device configured to measure the intensity or energy of the excitation light Le1.

The chiller control unit 52 is connected with the power monitor 48A, the power monitor 49, and the chiller 50. The chiller control unit 52 is a controller configured to change the temperature command value to the chiller 50 based on a result of monitoring by the power monitor 48A and a result of monitoring by the power monitor 49. The chiller control unit 52 calculates the transmittance of the excitation light Le1 through the laser crystal 42 based on the result of monitoring by the power monitor 48A and the result of monitoring by the power monitor 49, and changes the temperature command value to the chiller 50 so that the transmittance decreases.

9.2 Operation

The power monitor 48A monitors the power of the transmitted excitation light Le2 having transmitted through the laser crystal 42, converts the power of the transmitted excitation light Le2 into a monitor signal, and transmits the monitor signal to the chiller control unit 52.

The power monitor 49 monitors the power of the excitation light Le1 before transmitting through the laser crystal 42, converts the power into a monitor signal, and transmits the monitor signal to the chiller control unit 52. The chiller control unit 52 compares the power of the excitation light Le1 before transmitting through the laser crystal 42 and the power of the transmitted excitation light Le2 after having transmitted through the laser crystal 42, and calculates the transmittance of the excitation light Le1 through the laser crystal 42.

The power of the transmitted excitation light Le2 having transmitted through the laser crystal 42 is minimum when the wavelength of the excitation light Le1 is equal to a wavelength at which the absorption coefficient of the laser crystal 42 is maximum. In this case, the gain of the laser output is maximum and the output value is maximum in the solid-state laser 40D. The power of the transmitted excitation light Le2 having transmitted through the laser crystal 42 increases as the excitation light Le1 shifts to a wavelength at which the absorption coefficient is smaller. In this case, the gain of the laser output decreases and the output value decreases in the solid-state laser 40D.

The chiller control unit 52 changes the temperature command value to the chiller 50 based on the monitor signals from the power monitor 48A and the power monitor 49 so that the calculated transmittance decreases, preferably becomes minimum.

The chiller 50 controls the LD 41 to a desired temperature by controlling the temperature of the cooling water 51 circulating through the heat sink 43 to the temperature specified by the temperature command value.

The other configuration and operation may be substantially same as those of the laser apparatus according to the comparative example or Embodiment 1.

Similarly to the solid-state laser 40D according to Embodiment 7, a solid-state laser amplifier not including the first resonance mirror 46 and the second resonance mirror 47 like the laser apparatus according to any one of Embodiments 4 to 6 may include the power monitor 49. In the laser apparatus according to any one of Embodiments 4 to 6 as well, the chiller control unit 52 may change the temperature command value to the chiller 50 based on the result of monitoring by the power monitor 48A and the result of monitoring by the power monitor 49.

In a case of a solid-state laser amplifier, the power of the transmitted excitation light Le2 having transmitted through the laser crystal 42 is minimum when the wavelength of the excitation light Le1 is equal to a wavelength at which the absorption coefficient of the laser crystal 42 is maximum. In this case, the gain of the laser output is maximum and the output value is maximum in the solid-state laser amplifier. The power of the transmitted excitation light Le2 having transmitted through the laser crystal 42 increases as the excitation light Le1 shifts to a wavelength at which the absorption coefficient is smaller. In this case, the gain of the laser output decreases and the output value decreases in the solid-state laser amplifier.

9.3 Action/Effect

With the laser apparatus 301G according to Embodiment 7, the current temperature command value specified to the chiller 50 is changed so that the transmittance of the excitation light Le1 through the laser crystal 42 decreases when the transmittance has increased. Accordingly, decrease of the laser output from the solid-state laser 40D due to temporal change can be reduced. With the laser apparatus 301G according to Embodiment 7, since the transmittance of the excitation light Le1 through the laser crystal 42 is calculated based on the power monitor 48A and the power monitor 49, the absorption amount of excitation light in the laser crystal 42 can be estimated. This allows reduction of influence of disturbance when decrease of the laser output from the solid-state laser 40D is reduced.

<10. Embodiment 8> (EUV Light Generating System Including Pre-Pulse Laser Apparatus)

The following describes an EUV light generating system according to Embodiment 8 of the present disclosure. In the following description, a component substantially same as that of the EUV light generating system 11 illustrated in FIG. 1 is denoted by the same reference sign, and description thereof is omitted as appropriate.

10.1 Configuration and Operation

Figure 12:
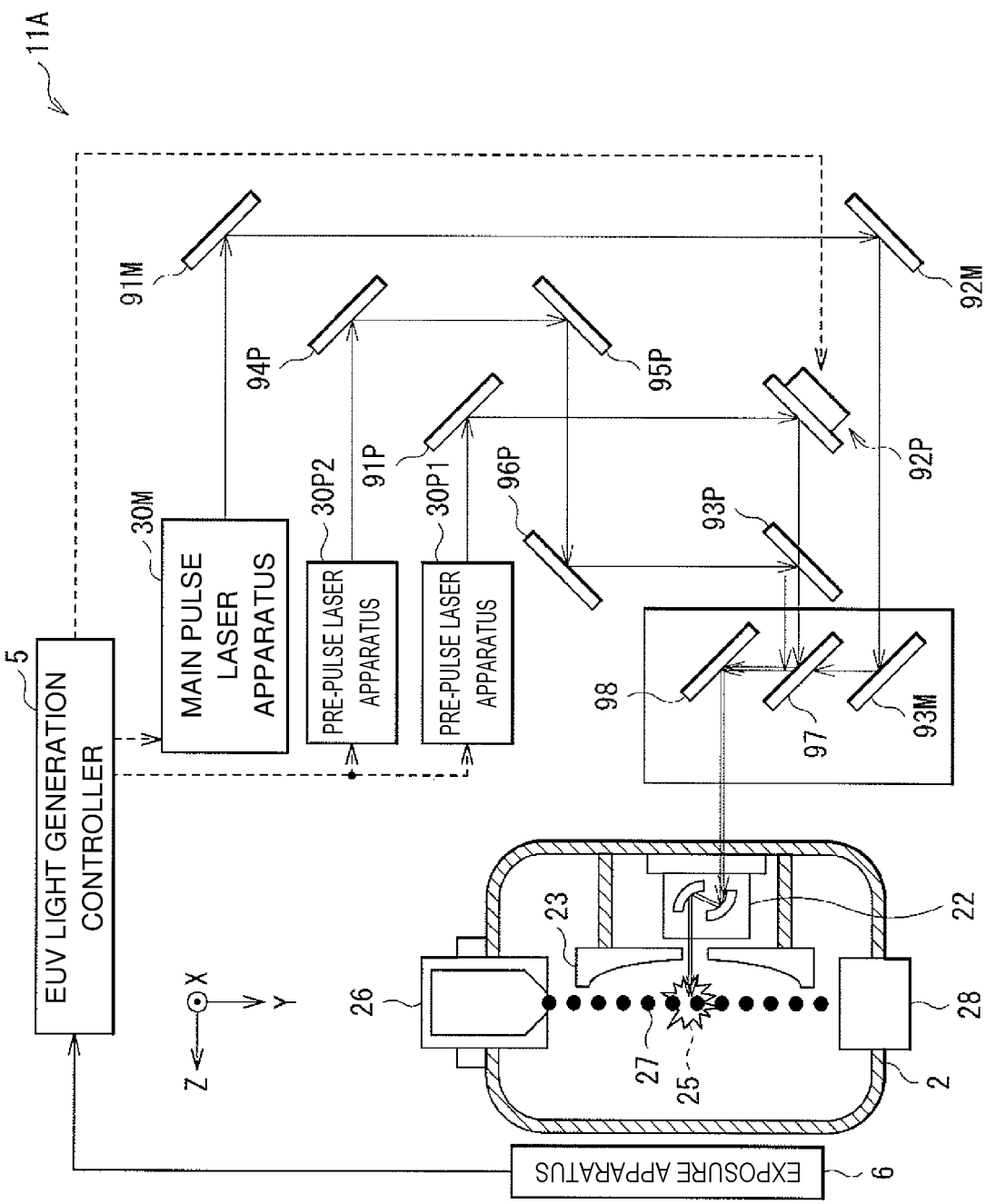
FIG. 12 schematically illustrates an exemplary configuration of an EUV light generating system to which the laser apparatus according to any one of Embodiments 1 to 7 is applied.

FIG. 12 schematically illustrates an exemplary configuration of an EUV light generating system 11A to which the laser apparatus according to any one of Embodiments 1 to 7 is applied. In the following, any configuration different from that of the EUV light generating system 11 illustrated in FIG. 1 will be mainly described.

In the EUV light generating system 11 illustrated in FIG. 1, the laser apparatus 3 may include a main pulse laser apparatus 30M configured to output a main pulse laser beam, and a pre-pulse laser apparatus configured to output a pre-pulse laser beam. The pre-pulse laser apparatus may include the laser apparatus according to any one of Embodiments 1 to 7.

FIG. 12 illustrates an exemplary configuration of the laser apparatus 3 including the main pulse laser apparatus 30M and two pre-pulse laser apparatus 30P1 and 30P2. At least one of the two pre-pulse laser apparatuses 30P1 and 30P2 may include the laser apparatus according to any one of Embodiments 1 to 7. Although FIG. 12 illustrates an exemplary configuration including the two pre-pulse laser apparatuses, the number of pre-pulse laser apparatuses may be one or may be equal to or larger than three.

The first pre-pulse laser apparatus 30P1 is, for example, a laser beam source having a wavelength of 1.06 μm and a pulse width shorter than 1 ns.

The second pre-pulse laser apparatus 30P2 is, for example, a laser beam source having a wavelength equal to that of the first pre-pulse laser apparatus 30P1 and a pulse width equal to or longer than 1 ns.

In the EUV light generating system 11A, reflection mirrors 91M, 92M, and 93M, a beam combiner 97, and a reflection mirror 98 are disposed on the optical path of the main pulse laser beam between the main pulse laser apparatus 30M and the chamber 2.

A reflection mirror 91P, an actuator-equipped reflection mirror 92P, a pre-pulse beam combiner 93P, the beam combiner 97, and the reflection mirror 98 are disposed on the optical path of the pre-pulse laser beam between the pre-pulse laser apparatus 30P1 and the chamber 2.

Reflection mirrors 94P, 95P, and 96P, the pre-pulse beam combiner 93P, the beam combiner 97, and the reflection mirror 98 are disposed on the optical path of the pre-pulse laser beam between the pre-pulse laser apparatus 30P2 and the chamber 2.

In the EUV light generating system 11A, the pre-pulse laser beam from the pre-pulse laser apparatus 30P1, the pre-pulse laser beam from the pre-pulse laser apparatus 30P2, and the main pulse laser beam from the main pulse laser apparatus 30M are sequentially output toward the inside of the chamber 2.

The actuator-equipped reflection mirror 92P includes an actuator configured to operate at high speed. The actuator-equipped reflection mirror 92P is disposed on the optical path of the pre-pulse laser beam from the first pre-pulse laser apparatus 30P1 that first irradiates the target 27.

The pre-pulse beam combiner 93P is disposed to substantially align the optical path of the pre-pulse laser beam from the first pre-pulse laser apparatus 30P1 and the optical path of the pre-pulse laser beam from the second pre-pulse laser apparatus 30P2 with each other.

The polarization directions of the pre-pulse laser beams output from the first pre-pulse laser apparatus 30P1 and the second pre-pulse laser apparatus 30P2 may be orthogonal to each other on the surface of the pre-pulse beam combiner 93P. In this case, the pre-pulse beam combiner 93P may be a polarization beam splitter.

The pre-pulse laser beam from the first pre-pulse laser apparatus 30P1 is guided to the pre-pulse beam combiner 93P by the reflection mirror 91P and the actuator-equipped reflection mirror 92P. The pre-pulse laser beam from the second pre-pulse laser apparatus 30P2 is guided to the pre-pulse beam combiner 93P by the reflection mirrors 94P, 95P, and 96P.

The aligned optical paths of the pre-pulse laser beam from the first pre-pulse laser apparatus 30P1 and the pre-pulse laser beam from the second pre-pulse laser apparatus 30P2 are substantially aligned with the optical path of the main pulse laser beam at the beam combiner 97. The beam combiner 97 is a dichroic mirror.

The actuator-equipped reflection mirror 92P can move the focusing position of the pre-pulse laser beam with which the target 27 is first irradiated on an XY plane in a plasma generating region 25. The actuator-equipped reflection mirror 92P is controlled by the EUV light generating controller 5 based on, for example, a detected value from an EUV sensor which is not illustrated configured to detect the barycenter value of EUV light. The EUV light generating controller 5 controls the actuator-equipped reflection mirror 92P so that, for example, the barycenter value of EUV light is fixed.

The pre-pulse laser beam from the first pre-pulse laser apparatus 30P1 generates a secondary target of small droplets dispersed in space through irradiation of droplets of the target 27. The pre-pulse laser beam from the second pre-pulse laser apparatus 30P2 generates a tertiary target of fine particles relatively uniformly dispersed in space through irradiation of the secondary target. In this case, the droplet radius is less than the diffusion range of the secondary target, and thus "the radius of target irradiation by the first pre-pulse laser apparatus 30P1" is less than "the radius of target irradiation by the second pre-pulse laser apparatus 30P2". The main pulse laser apparatus 30M irradiates the tertiary target at a timing when the fine particles are yet to be much diffused. Thus, "the radius of target irradiation by the second pre-pulse laser apparatus 30P2" is roughly equal to "the radius of target irradiation by the main pulse laser apparatus 30M".

When one target 27 is sequentially irradiated with a plurality of laser beams in this manner, the first pre-pulse laser apparatus 30P1 that first irradiates the target 27 largely affects EUV barycenter control. Thus, optical axis control of the first pre-pulse laser apparatus 30P1 is performed by the actuator-equipped reflection mirror 92P.

The other configuration and operation may be substantially same as those of the EUV light generating system 11 illustrated in FIG. 1.

(Other)

The laser apparatus according to any one of Embodiments 1 to 7 is also applicable to usage other than usage as a laser apparatus in an EUV light generating system.

<11. Embodiment 9> (Electronic Device Manufacturing Method)

The laser apparatus according to any one of Embodiments 1 to 7 and the EUV light generating system according to Embodiment 8 are applicable to a method of manufacturing an electronic device such as a semiconductor device. The following describes a specific example.

Figure 13:
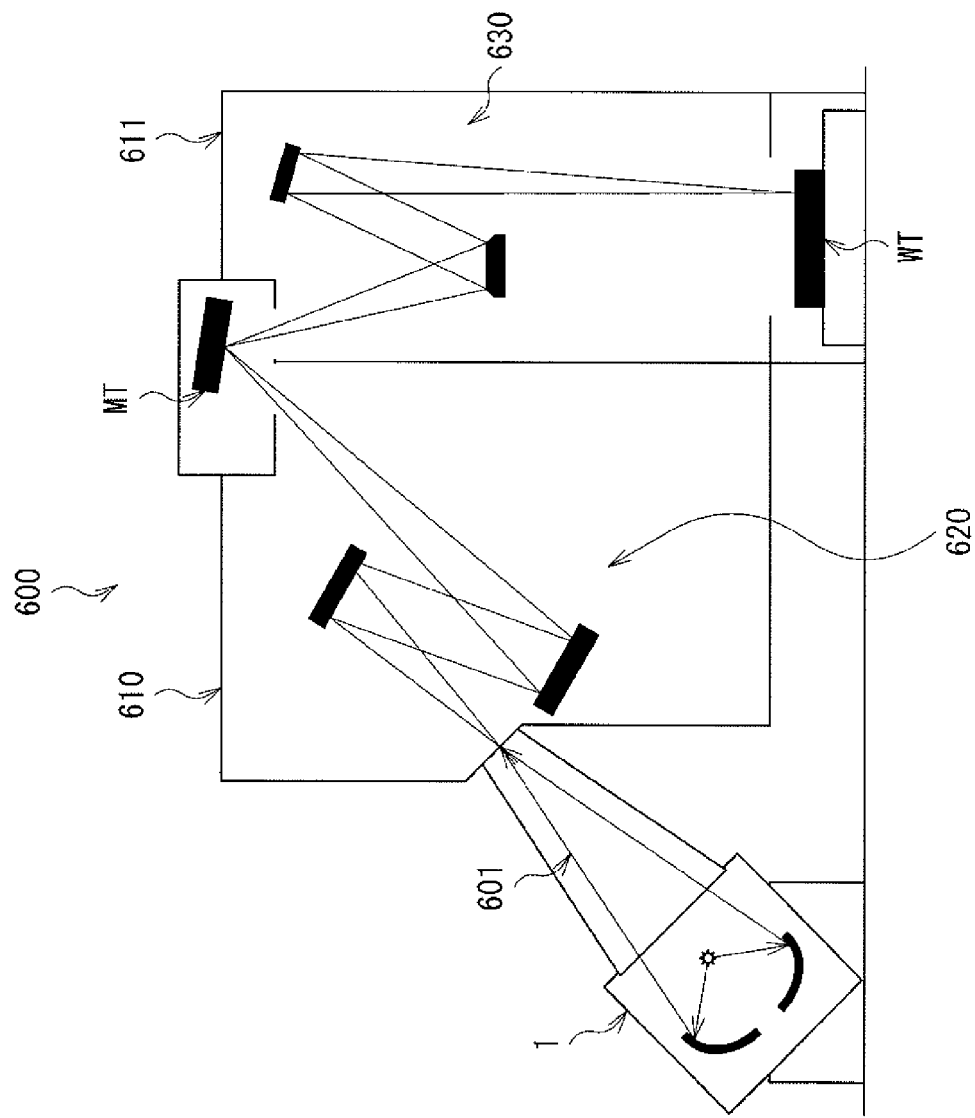
FIG. 13 schematically illustrates an exemplary configuration of an exposure apparatus used in semiconductor device manufacturing.

FIG. 13 schematically illustrates an exemplary configuration of an exposure apparatus 600 used in semiconductor device manufacturing.

In FIG. 13, the exposure apparatus 600 includes a mask irradiation unit 610 and a workpiece irradiation unit 611.

The mask irradiation unit 610 illuminates a mask pattern on a mask table MT with EUV light 601 incident from the EUV light generating apparatus 1 through a reflection optical system 620.

The workpiece irradiation unit 611 images the EUV light 601 reflected by the mask table MT on a workpiece which is not illustrated disposed on a workpiece table WT through a reflection optical system 630.

The workpiece is a photosensitive substrate such as a semiconductor wafer on which photoresist is applied.

The exposure apparatus 600 translates the mask table MT and the workpiece table WT in synchronization to expose the workpiece to the EUV light 601 reflected by the mask pattern. Through the exposure process as described above, a device pattern is transferred onto the semiconductor wafer, thereby manufacturing a semiconductor device.

12. Other

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. A laser apparatus comprising:
   an excitation light source configured to output excitation light;
   a laser crystal disposed on an optical path of the excitation light;
   a first monitor device disposed on an optical path of transmitted excitation light after having transmitted through the laser crystal to monitor the transmitted excitation light;
   a temperature adjustment device configured to adjust a temperature of the excitation light source to a constant temperature based on a temperature command value;
   a controller configured to change the temperature command value based on a result of monitoring by the first monitor device; and
   a second monitor device disposed on the optical path of the excitation light to monitor the excitation light before transmitting through the laser crystal,
   wherein the controller calculates a transmittance of the excitation light through the laser crystal based on a result of monitoring by the first monitor device and a result of monitoring by the second monitor device, and changes the temperature command value for the temperature adjustment device so that the transmittance decreases.

2. The laser apparatus according to claim 1, wherein
   the temperature adjustment device includes cooling water, and
   the temperature command value is a command value that specifies a temperature of the cooling water.

3. The laser apparatus according to claim 1, wherein the laser apparatus is a laser oscillator configured to output a laser beam generated when the excitation light is incident on the laser crystal.

4. The laser apparatus according to claim 3, further comprising a resonator configured to resonate the laser beam generated by the laser crystal.

5. An EUV light generating system comprising:
   an EUV chamber in which EUV light is generated; and
   a laser apparatus configured to emit a laser beam to be guided to the EUV chamber,
   the laser apparatus including
      an excitation light source configured to output excitation light;
      a laser crystal disposed on an optical path of the excitation light;
      a first monitor device disposed on an optical path of transmitted excitation light after having transmitted through the laser crystal to monitor the transmitted excitation light;
      a temperature adjustment device configured to adjust a temperature of the excitation light source to a constant temperature based on a temperature command value;
      a controller configured to change the temperature command value based on a result of monitoring by the first monitor device; and
      a second monitor device disposed on the optical path of the excitation light to monitor the excitation light before transmitting through the laser crystal,
      wherein the controller calculates a transmittance of the excitation light through the laser crystal based on a result of monitoring by the first monitor device and a result of monitoring by the second monitor device, and changes the temperature command value for the temperature adjustment device so that the transmittance decreases.

6. An electronic device manufacturing method comprising:
   generating EUV light by an EUV light generating apparatus including
      an excitation light source configured to output excitation light,
      a laser crystal disposed on an optical path of the excitation light,
      a first monitor device disposed on an optical path of transmitted excitation light after having transmitted through the laser crystal to monitor the transmitted excitation light,
      a temperature adjustment device configured to adjust a temperature of the excitation light source to a constant temperature based on a temperature command value,
      a controller configured to change the temperature command value based on a result of monitoring by the first monitor device; and
      a second monitor device disposed on the optical path of the excitation light to monitor the excitation light before transmitting through the laser crystal,
      wherein the controller calculates a transmittance of the excitation light through the laser crystal based on a result of monitoring by the first monitor device and a result of monitoring by the second monitor device, and changes the temperature command value for the temperature adjustment device so that the transmittance decreases;
   outputting the EUV light to an exposure apparatus; and
   exposing a photosensitive substrate to the EUV light by using the exposure apparatus to manufacture an electronic device.

* * * * *